(12) United States Patent     (10) Patent No.:   US 12,660,435 B2

Yuan et al.     (45) Date of Patent:     Jun. 16, 2026

(54) DISPLAY SUBSTRATE AND DISPLAY DEVICE

(71) Applicants:HEFEI BOE JOINT TECHNOLOGY CO., LTD., Hefei (CN); BOE TECHNOLOGY GROUP CO., LTD., Beijing (CN)

(72) Inventors: Can Yuan, Beijing (CN); Yongqian Li, Beijing (CN); Pan Xu, Beijing (CN); Zhidong Yuan, Beijing (CN); Dacheng Zhang, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 928 days.

(21) Appl. No.: 17/789,210

(22) PCT Filed: Jul. 9, 2021

(86) PCT No.: PCT/CN2021/105495

§ 371 (c)(1),
(2) Date: Jun. 26, 2022

(87) PCT Pub. No.: WO2023/279374

PCT Pub. Date: Jan. 12, 2023

(65) Prior Publication Data

US 2024/0179968 A1     May 30, 2024

(51) Int. Cl.
*H10K 59/131*     (2023.01)
*G09G 3/32*     (2016.01)
(Continued)

(52) U.S. Cl.
CPC ......... *H10K 59/131* (2023.02); *G09G 3/3225* (2013.01); *H10K 59/122* (2023.02);
(Continued)

(58) Field of Classification Search
CPC ... G09G 2300/0408; G09G 2300/0426; G09G 2300/0452; G09G 2300/0819; G09G 2300/0842; G09G 3/3233
See application file for complete search history.

(56) References Cited

U.S. PATENT DOCUMENTS

| | | | |
|---|---|---|---|
| 2015/0116191 A1 | 4/2015 | Qi et al. | |
| 2018/0137818 A1* | 5/2018 | Kim ..................... | G09G 3/2003 |

(Continued)

FOREIGN PATENT DOCUMENTS

| | | |
|---|---|---|
| CN | 103413519 A | 11/2013 |
| CN | 107086023 A | 8/2017 |

(Continued)

*Primary Examiner* — Monica D Harrison
*Assistant Examiner* — Moataz Khalifa
(74) *Attorney, Agent, or Firm* — BROOKS KUSHMAN P.C.

(57) ABSTRACT

A display substrate includes: a substrate and a plurality of subpixels arranged on the substrate, the plurality of subpixels are arranged in an array; the subpixel includes a subpixel driving circuit and a light emitting element, and the subpixel driving circuit includes a driving sub-circuit and a light emitting control sub-circuit coupled to each other; the light emitting element includes an anode pattern; the plurality of subpixels are divided into a plurality of groups of subpixels, each group of subpixels includes two subpixels arranged along a first direction, and two subpixel driving circuits included in the two subpixels share a same light emitting control sub-circuit, the light emitting control sub-circuit is configured to respectively control the driving sub-circuits in the two subpixels to write a driving signal to the anode pattern; the subpixel further includes a data line including a part extending along the first direction.

16 Claims, 16 Drawing Sheets

(51) Int. Cl.

|  |  |
|---|---|
| *G09G 3/3225* | (2016.01) |
| *G09G 3/3233* | (2016.01) |
| *H10K 59/121* | (2023.01) |
| *H10K 59/122* | (2023.01) |

(52) U.S. Cl.

CPC ............... *G09G 2300/0408* (2013.01); *G09G 2300/0426* (2013.01); *G09G 2300/0452* (2013.01); *G09G 2300/0819* (2013.01); *G09G 2300/0842* (2013.01); *G09G 2310/08* (2013.01)

(56) References Cited

U.S. PATENT DOCUMENTS

| 2019/0043418 A1 | 2/2019 | Rieutort-Louis et al. |
| 2019/0172895 A1 | 6/2019 | Liu |

| 2019/0371245 A1 | 12/2019 | Yuan et al. |
| 2020/0118494 A1* | 4/2020 | Park ..................... G09G 3/3258 |
| 2021/0217348 A1* | 7/2021 | Liu ...................... G09G 3/2074 |
| 2021/0335234 A1* | 10/2021 | Yin ..................... G09G 3/3291 |
| 2021/0335890 A1 | 10/2021 | Li |
| 2021/0335987 A1* | 10/2021 | Kim ..................... H04N 23/51 |
| 2022/0180816 A1 | 6/2022 | Yuan et al. |

FOREIGN PATENT DOCUMENTS

| CN | 108400101 A | | 8/2018 | |
| CN | 109004012 A | | 12/2018 | |
| CN | 110660837 A | | 1/2020 | |
| CN | 110675826 A | * | 1/2020 | .......... G09G 3/3233 |
| CN | 110910829 A | | 3/2020 | |
| CN | 111179828 A | | 5/2020 | |
| CN | 111816123 A | | 10/2020 | |
| CN | 111968576 A | | 11/2020 | |
| CN | 213692056 U | * | 7/2021 | |

* cited by examiner

DISPLAY SUBSTRATE AND DISPLAY DEVICE

CROSS-REFERENCE TO RELATED APPLICATION

This application is the U.S. national phase of PCT Application No. PCT/CN2021/105495 filed on Jul. 9, 2021, which is incorporated herein by reference in its entirety.

TECHNICAL FIELD

The present disclosure relates to the field of display technology, and more particularly to a display substrate and a display device.

BACKGROUND

With the continuous development of display technology, organic light emitting diode (OLED) display products are widely used for their high brightness, low power consumption, fast response, high definition, good flexibility and high light emitting efficiency. With the gradual development of the OLED display product market, the demand for special-shaped OLED display products is also increasing.

SUMMARY

The present disclosure aims to provide a display substrate and a display device.

A first aspect of the present disclosure provides a display substrate, including a substrate and a plurality of subpixels arranged on the substrate, wherein the plurality of subpixels are arranged in an array; the subpixel includes a subpixel driving circuit and a light emitting element, and the subpixel driving circuit includes a driving sub-circuit and a light emitting control sub-circuit that are coupled to each other; the light emitting element includes an anode pattern; the plurality of subpixels are divided into a plurality of groups of subpixels, each group of subpixels includes two subpixels arranged along a first direction, and two subpixel driving circuits included in the two subpixels share a same light emitting control sub-circuit, the light emitting control sub-circuit is configured to respectively control the driving sub-circuits in the two subpixels to write a driving signal to the anode pattern; the subpixel further includes a data line, the data line includes a part extending along the first direction.

Optionally, the subpixel further comprises: a light emitting control signal line, wherein the light emitting control signal line includes a part extending along a second direction, the second direction intersects the first direction; the two subpixel driving circuits included in the two subpixels share the same light emitting control signal line, and the light emitting control signal line is coupled to the light emitting control sub-circuit and configured to control the light emitting control sub-circuit; an orthographic projection of the light emitting control signal line on the substrate is located between orthographic projections of two anode patterns included in the two subpixels on the substrate.

Optionally, the light emitting control sub-circuit comprises a light emitting control transistor, and a gate electrode of the light emitting control transistor is coupled to the light emitting control signal line, and a second electrode of the light emitting control transistor is coupled to the driving sub-circuit; the light emitting control transistor includes a light emitting control active layer, the light emitting control active layer includes a part extending along the second direction, and an orthographic projection of the light emitting control active layer on the substrate is located between the orthographic projections of the two anode patterns included in the two subpixels on the substrate.

Optionally, the subpixel further comprises: a power line, wherein the power line includes a part extending along the first direction, and power lines included in the two subpixels are coupled to each other; a first electrode of the light emitting control transistor is coupled to the power line, and the light emitting control transistor is configured to connect or disconnect the power line and the driving sub-circuits in the two subpixels under the control of the light emitting control signal line.

Optionally, the subpixel further comprises: a power connection portion, wherein the power connection portion includes a part extending along the second direction; the two subpixel driving circuits included in the two subpixels share a same power connection portion; an orthographic projection of the power line on the substrate along the second direction is located on a side of an orthographic projection of the light emitting control active layer on the substrate, and the first electrode of the light emitting control transistor is coupled to the power line through the power supply connection portion.

Optionally, the power connection portion and the light emitting control signal line are arranged at a same layer and made of a same material.

Optionally, the plurality of subpixels are divided into a plurality of pixel units, and the pixel unit includes at least two subpixels arranged along the second direction; the at least two subpixels share a same power line, and the power connection portions included in the at least two subpixels are sequentially coupled.

Optionally, the driving sub-circuit comprises a driving transistor, and a first electrode of the driving transistor is coupled to the second electrode of the light emitting control transistor, a second electrode of the driving transistor is coupled to the anode pattern of the light emitting element; the driving transistor includes a driving active layer; in the two subpixel driving circuits, driving active layers included in the two driving transistors are symmetrically arranged along a symmetry axis, and the symmetry axis is extended along the second direction, an orthographic projection of the symmetry axis on the substrate is located between the orthographic projections of the two anode patterns included in the two subpixels on the substrate.

Optionally, the orthographic projection of the symmetry axis on the substrate overlaps the orthographic projection of the light emitting control active layer on the substrate.

Optionally, the subpixel further comprises a first scan line, the first scan line includes a part extending along the second direction; the subpixel driving circuit further includes a first transistor, a gate electrode of the first transistor is coupled to the first scan line, and a first electrode of the first transistor is coupled to the data line, a second electrode of the first transistor is coupled to the gate electrode of the driving transistor; the first transistor includes a first active layer, the first active layer includes a part extending along the second direction; in a same subpixel, the first active layer, the driving active layer and the light emitting control active layer are sequentially arranged along the first direction.

Optionally, in the two subpixel driving circuits, the first active layers included in the two first transistors are symmetrically arranged with respect to the symmetry axis.

Optionally, the plurality of subpixels are divided into a plurality of pixel units, and at least part of the pixel units include a first subpixel, a second subpixel and a third subpixel arranged along the second direction, the first subpixel includes a first data line, the second subpixel includes a second data line, and the third subpixel includes a third data line; in a first part of pixel units, the first data line is located on a side of the first subpixel away from the second subpixel along the second direction, and the second data line and the third data line are all located between the second subpixel and the third subpixel; there is a first spacer region between the first subpixel and the second subpixel; in a second part of pixel units, the first data line and the second data line are both located between the first subpixel and the second subpixel, and the third data line is located on a side of the third subpixel away from the second subpixel along the second direction; there is a second spacer region between the second subpixel and the third subpixel.

Optionally, the plurality of groups of subpixels are divided into a plurality of rows of subpixel groups arranged along the first direction, and each row of subpixel groups include a plurality of groups of subpixels arranged in the second direction; the display substrate further includes a plurality of gate driving circuit layout areas and a plurality of gate driving wiring layout areas; the plurality of gate driving circuit layout areas are in one-to-one correspondence with the plurality of rows of subpixel groups, and each gate driving circuit layout area includes a first layout area and a second layout area, along the first direction, the first layout area is located on a first side of the corresponding row of subpixel groups, and the second layout area is located on a second side of the corresponding row of subpixel groups; the plurality of gate driving circuit layout areas are in one-to-one correspondence with the plurality of gate driving wiring layout areas, and the gate driving wiring layout area includes at least two third layout areas arranged along the second direction; in the at least two third layout areas, at least one third layout area is located in the first spacer region in a corresponding row of subpixel groups; the at least one third layout area is located in the second spacer region in a corresponding row of the subpixel groups.

Optionally, the subpixel further comprises a reference signal line and a second scan line, and the reference signal line includes a part extending along the first direction, the second scan line includes a part extending along the second direction; the subpixel driving circuit further includes a second transistor, a gate electrode of the second transistor is coupled to the second scan line, a first electrode of the second transistor is coupled to the reference signal line, and a second electrode of the second transistor is coupled to the gate electrode of the driving transistor; the second transistor includes a second active layer, and the second active layer includes a part extending along the second direction; in a same subpixel, the second active layer, the first active layer and the light emitting control active layer are sequentially arranged along the first direction.

Optionally, in the two subpixel driving circuits, second active layers included in two second transistors are symmetrically arranged with respect to the symmetry axis.

Optionally, the subpixel further comprises a reference connection portion, and the reference connection portion includes a part extending along the second direction; a first electrode of the second transistor is coupled to the reference signal line through the reference connection portion.

Optionally, the plurality of subpixels are divided into a plurality of pixel units, and the pixel unit includes at least two subpixels arranged along the second direction; subpixels included in two adjacent pixel units arranged along the second direction share one reference signal line, and the reference signal line is located between the two adjacent pixel units, the reference connection portions included in the subpixels are sequentially coupled.

Optionally, in a same subpixel, an orthographic projection of the reference connection portion on the substrate, an orthographic projection of the second scan line on the substrate, an orthographic projection of the first scan line on the substrate, and an orthographic projection of the light emitting control signal line on the substrate are sequentially arranged along the first direction.

Optionally, the subpixel further comprises an initialization signal line and a third scan line, each of the initialization signal line and the third scan line includes a part extending along the second direction; the subpixel driving circuit further includes a third transistor, a gate electrode of the third transistor is coupled to the third scan line, and a first electrode of the third transistor is connected to the initialization signal line, and a second electrode of the third transistor is coupled to the anode pattern of the light emitting element; the third transistor includes a third active layer; in the same subpixel, the first active layer, the third active layer and the light emitting control active layer are sequentially arranged along the first direction.

Optionally, in the two subpixel driving circuits, third active layers included in two third transistors are symmetrically arranged with respect to the symmetry axis.

Optionally, at least one of the first transistor, the second transistor and the third transistor includes a double gate structure.

Optionally, the subpixel driving circuit further comprises a storage capacitor, and the storage capacitor includes a first electrode plate and a second electrode plate arranged oppositely, the first electrode plate is located between the substrate and the second electrode plate; the first electrode plate is coupled to the gate electrode of the driving transistor, the second electrode plate is respectively coupled to the second electrode of the driving transistor and the anode pattern of the light emitting element; in two subpixel driving circuits, two first electrode plates are symmetrically arranged with respect to the symmetry axis; and/or, two second electrode plates are symmetrically arranged with respect to the symmetry axis.

Optionally, the subpixel further includes a first conductive connection portion and a second conductive connection portion that are arranged at different layers, the first conductive connection portion is located between the substrate and the second conductive connection portion, the anode pattern is located on a side of the second conductive connection portion away from the substrate; the second electrode plate is coupled to the first conductive connection portion; there is a first overlapping area between an orthographic projection of the second conductive connection portion on the substrate and an orthographic projection of the first conductive connection portion on the substrate, and there is a second overlapping area between the orthographic projection of the second conductive connection portion on the substrate and the orthographic projection of the anode pattern on the substrate; the second conductive connection portion is coupled to the first conductive connection portion through a first via hole, and an orthographic projection of the first via hole on the substrate is located in the first overlapping area; the second conductive connection portion is coupled to the anode pattern through a second via hole, and an orthographic projection of the second via hole on the substrate is located in the second overlapping area.

Optionally, at least part of the orthographic projection of the first conductive connection portion on the substrate is located between the orthographic projection of the third active pattern on the substrate and the orthographic projection of the driving active layer on the substrate.

Optionally, the third active layer includes a first portion and a second portion coupled to each other, and the first portion includes a part extending along the first direction, the second portion includes a part extending along the second direction, the first portion and the second portion are formed into an L-shaped structure; in the same subpixel, the third active layer and the driving active layer are arranged along a third direction, and the third direction intersects both the first direction and the second direction; a 90-degree angle of the L-shaped structure faces the driving active layer.

Optionally, the display substrate further comprises a data fan-out line arranged on the substrate, the data fan-out line is coupled to a corresponding data line, and the data fan-out line and the second conductive connection portion are arranged at a same layer and made of a same material.

Optionally, the display substrate further comprises a pixel defining layer, and the pixel defining layer defines a plurality of pixel openings, and the plurality of pixel openings are in one-to-one correspondence to the plurality of subpixels included in the display substrate; an orthographic projection of the first active layer on the substrate is located within an orthographic projection of a corresponding pixel opening on the substrate; an orthographic projection of the second active layer on the substrate is located within an orthographic projection of a corresponding pixel opening on the substrate; an orthographic projection of the third active layer on the substrate is located within an orthographic projection of the pixel defining layer on the substrate; an orthographic projection of the light emitting control active layer on the substrate is located within the orthographic projection of the pixel-defining layer on the substrate; an orthographic projection of the driving active layer on the substrate partially overlaps each of the orthographic projection of the pixel defining layer on the substrate and an orthographic projection of a corresponding pixel opening on the substrate.

A second aspect of the present disclosure provides a display device comprising the display substrate.

BRIEF DESCRIPTION OF THE DRAWINGS

The accompanying drawings described herein are used to provide a further understanding of the present disclosure and constitute a part of the present disclosure. The exemplary embodiments of the present disclosure are used to explain the present disclosure and do not constitute an improper limitation of the present disclosure.

DETAILED DESCRIPTION

Figure 1:
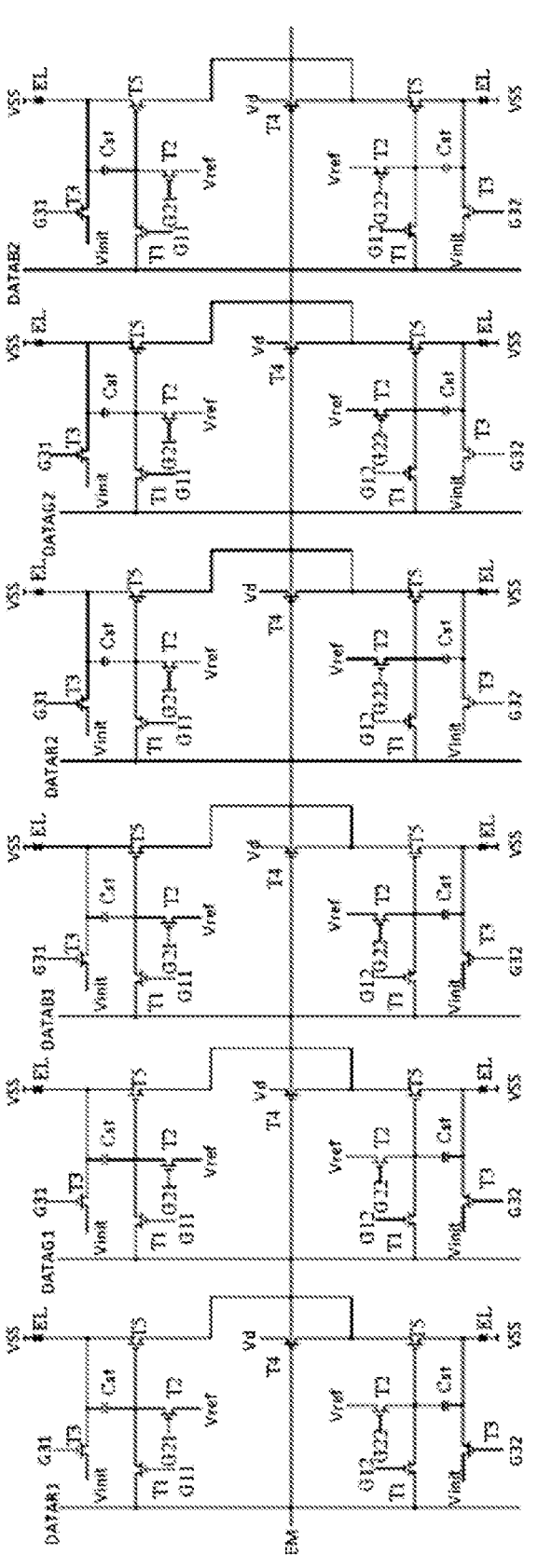
FIG. 1 is a circuit diagram corresponding to a minimum repeating unit in a display substrate provided by an embodiment of the present disclosure.

In order to further illustrate the display substrate and the display device provided by the embodiments of the present disclosure, a detailed description is given below with reference to the accompanying drawings.

In order to better ensure the customized needs of special-shaped OLED display products, it is possible to consider setting the gate driving circuit in the OLED display product in the display area, that is, using Gate Driver In AA (GIA) technology, but the gate driving circuit will occupy part of the space in the display area and affects the resolution of the display product.

Referring to FIG. 1, FIG. 3, FIG. 15 and FIG. 16, an embodiment of the present disclosure provides a display substrate, including: a substrate and a plurality of subpixels 20 arranged on the substrate, and the plurality of subpixels 20 are arranged in an array;

The subpixel includes a subpixel driving circuit 201 and a light emitting element EL, and the subpixel driving circuit 201 includes a driving sub-circuit and a light emitting control sub-circuit that are coupled to each other; the light emitting element EL includes an anode pattern 80;

The plurality of subpixels are divided into a plurality of groups of subpixels, each group of subpixels A includes two subpixels arranged along a first direction, and two subpixel driving circuits 201 included in the two subpixels share a same light emitting control sub-circuit, wherein the light emitting control sub-circuit is configured to respectively control the driving sub-circuits in the two subpixels to write a driving signal to the anode pattern 80;

The subpixel further includes a data line including a part extending along the first direction.

Exemplarily, the display substrate includes a display area and a peripheral area surrounding the display area. The display substrate includes a plurality of subpixels, and the plurality of subpixels are arranged in an array in the display area.

Exemplarily, the subpixel includes a subpixel driving circuit 201 and a light emitting element, the subpixel driving circuit 201 is coupled to the light emitting element, and is configured to provide a driving signal to the light emitting element, so as to realize driving the light emitting element to emit light. Exemplarily, the subpixel driving circuit 201 includes a 5T1C circuit structure, that is, five thin film transistors and one storage capacitor Cst. Exemplarily, the light emitting element includes an anode pattern 80, a light emitting functional layer and a cathode layer that are sequentially stacked along a direction away from the substrate; the light emitting functional layer includes an electron injection layer, an electron transport layer, and an organic light emitting material layer, a hole transport layer and hole injection layer that are stacked in layers. Exemplarily, the cathode layer receives a negative power signal VSS.

Exemplarily, in the plurality of subpixels, the electron injection layers included in the plurality of subpixels are formed into an integrated structure, which can cover the entire display area; similarly, the electron transport layers, the hole transport layers and the hole injection layers included in the plurality of subpixels can also be formed into an integrated structure, which can cover the entire display area. Exemplarily, the cathode layers included in the plurality of subpixels form an integrated structure, which can cover the entire display area.

Exemplarily, the plurality of subpixels are divided into a plurality of groups of subpixels, the plurality of groups of subpixels are arranged in an array, and each subpixel can only belong to one group of subpixels. Exemplarily, each group of subpixels includes two subpixels arranged along a first direction, and the first direction includes a vertical direction. Exemplarily, the two subpixels arranged along the first direction include: layout areas of two subpixel driving circuits 201 included in the two subpixels are arranged along the first direction; and/or, anode patterns 80 in two light emitting elements included in the two subpixels are arranged along the first direction.

Exemplarily, each subpixel driving circuit 201 includes a driving sub-circuit and a light emitting control sub-circuit, the light emitting control sub-circuit is coupled to the driving sub-circuit, and the light emitting control sub-circuit is used to control the driving sub-circuit to write a driving signal into the anode pattern 80, so as to control the light emitting condition of the light emitting element.

Exemplarily, each group of subpixels includes two subpixels arranged along the first direction, and the two subpixel driving circuits 201 included in the two subpixels share the same light emitting control sub-circuit, that is, the light emitting control sub-circuit is respectively coupled to the two driving sub-circuits in the two subpixel driving circuits 201, and the light emitting control sub-circuit respectively controls the two driving sub-circuits to write the driving signal to the corresponding anode patterns 80.

According to the specific structure of the above-mentioned display substrate, in the display substrate provided by the embodiments of the present disclosure, the plurality of subpixels are divided into a plurality of groups of subpixels, and two subpixel driving circuits 201 included in each group of subpixels are configured to share the same light emitting control sub-circuit, which reduces the number of light emitting control sub-circuits, and effectively reduces the layout space occupied by each group of subpixels. Therefore, the layout of a plurality of subpixels is optimized in the display substrate provided by the embodiment of the present, which not only ensures that the display substrate can achieve high-resolution display, but also is compatible with Gate On Array (GOA) logic resources in a better way, and provides technical support for special-shaped display products to achieve high-resolution GIA display.

As shown in FIG. 1, FIG. 3, FIG. 6 and FIG. 16, in some embodiments, the subpixels further include:

a light emitting control signal line 44, the light emitting control signal line 44 includes a part extending along a second direction, the second direction intersects the first direction;

The two subpixel driving circuits 201 included in the two subpixels share the same light emitting control signal line 44, and the light emitting control signal line 44 is coupled to the light emitting control sub-circuit for controlling the light emitting control sub-circuit; an orthographic projection of the light emitting control signal line 44 on the substrate is located between orthographic projections of the two anode patterns 80 included in the two subpixels on the substrate.

Exemplarily, the first direction includes a vertical direction, and the second direction includes a horizontal direction.

Exemplarily, the two subpixel driving circuits 201 included in the two subpixels share the same light emitting control signal line 44, and the light emitting control signal line 44 is respectively coupled to the light emitting control sub-circuit and the corresponding gate driving circuit, and the light emitting control signal line 44 is configured to transmit the light emitting control signal EM provided by the gate driving circuit to the light emitting control sub-circuit, and the light emitting control sub-circuit is configured to control the two driving sub-circuits coupled thereto to write driving signals to the corresponding anode patterns 80 under the control of the light emitting control signal EM.

The above arrangement of the two subpixel driving circuits 201 included in the two subpixels sharing the same light emitting control signal line 44 reduces the number of the light emitting control signal lines 44 and effectively reduces the layout space occupied by each group of subpixels.

The orthographic projection of the light emitting control signal line 44 on the substrate is located between the orthographic projections of the two anode patterns 80 included in the two subpixels on the substrate, so that the light emitting control signal line 44 is roughly located between the two subpixels, the light emitting control sub-circuit is arranged near the light emitting control signal line 44, which not only ensures the good connection performance of the light emitting control sub-circuit and the light emitting control signal line 44, and the two driving sub-circuits, but also effectively reduces the layout difficulty of the light emitting control signal line 44 and the light emitting control sub-circuit.

As shown in FIG. 1, FIG. 3, FIG. 5, FIG. 6, FIG. 10 and FIG. 12, in some embodiments, the light emitting control sub-circuit includes a light emitting control transistor T4, and the gate electrode of the light emitting control transistor T4 is coupled to the light emitting control signal line 44, and the second electrode of the light emitting control transistor T4 is coupled to the driving sub-circuit;

The light emitting control transistor T4 includes a light emitting control active layer 34, the light emitting control active layer 34 includes a part extending along the second direction, and an orthographic projection of the light emitting control active layer 34 on the substrate is located between the orthographic projections of the two anode patterns 80 included in the two subpixels on the substrate.

Exemplarily, when the light emitting control signal EM provided by the light emitting control signal line 44 is a valid level, the light emitting control transistor T4 is turned on, and when the light emitting control signal EM provided by the light emitting control signal line 44 is an invalid level, the light emitting control transistor T4 is turned off.

Figure 3:
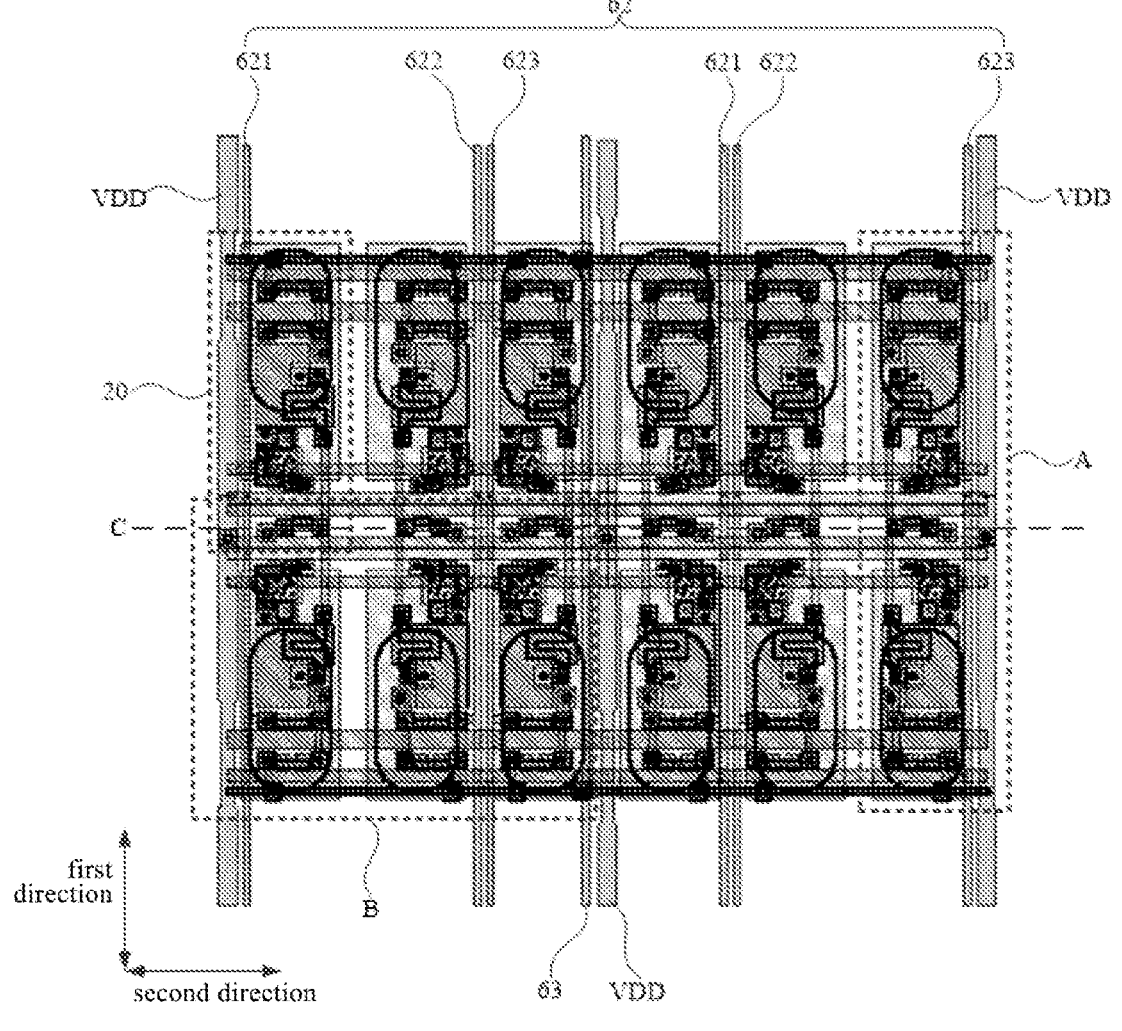
FIG. 3 is a schematic diagram of a layout corresponding to the circuit diagram in FIG. 1.
Figure 8:
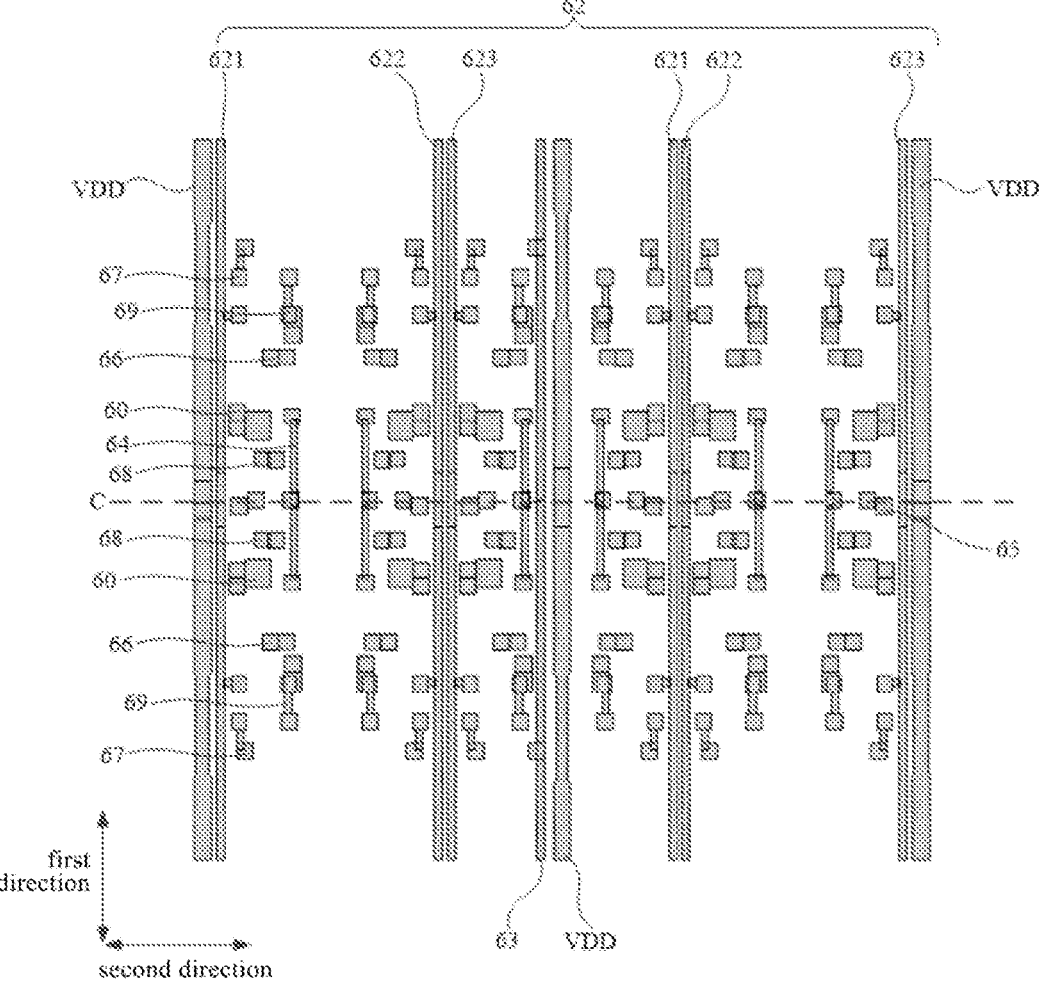
FIG. 8 is a schematic diagram of a layout of a first source-drain metal layer in FIG. 3.
Figure 12:
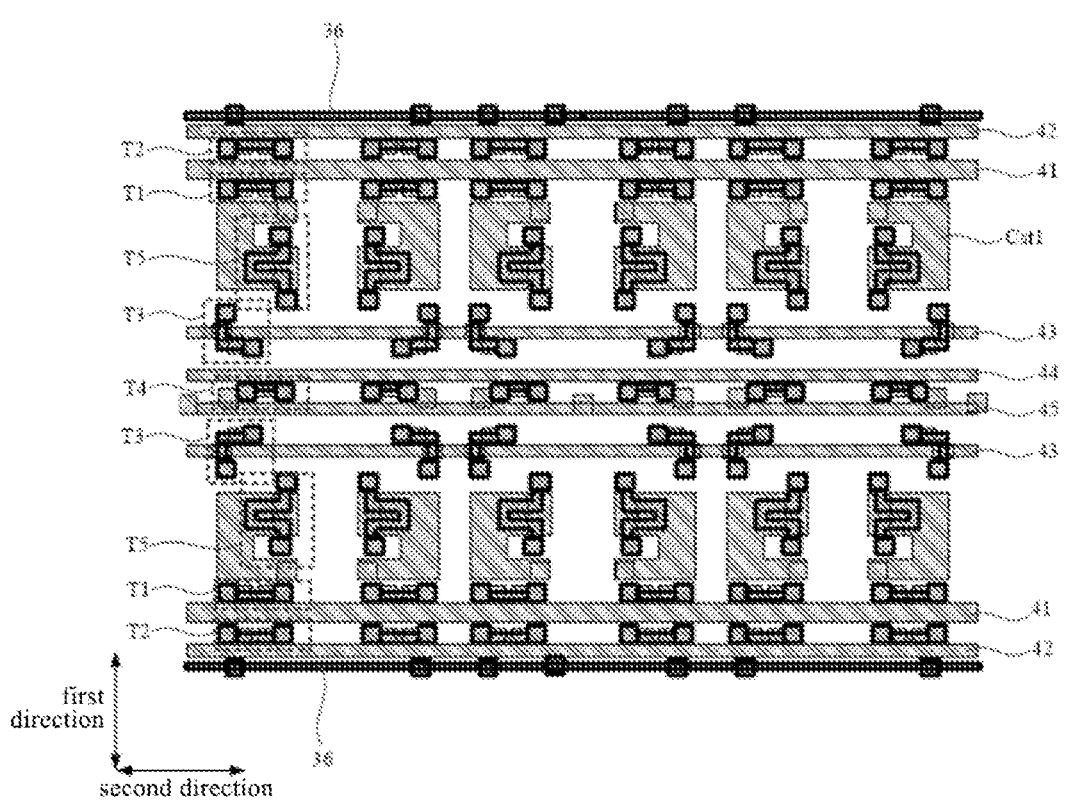
FIG. 12 is a schematic diagram of a layout of the active layer and the first gate metal layer in FIG. 3.

Exemplarily, the gate electrode of the light emitting control transistor T4 and the light emitting control signal line 44 coupled thereto are formed into an integrated structure. Exemplarily, the second electrode of the light emitting control transistor T4 is coupled to the driving sub-circuit through the first conductive pattern 64. As shown in FIG. 3, FIG. 8 and FIG. 12, exemplarily, in one group of subpixels, the second electrode of the light emitting control transistor T4 is respectively coupled to two driving sub-circuits of the group of subpixels through the first conductive pattern 64. Exemplarily, the first conductive pattern 64 includes a part extending along the first direction. Exemplarily, the first conductive pattern 64 and the data line in the display substrate are arranged at the same layer and made of the same material. Exemplarily, an orthographic projection of the first conductive pattern 64 on the substrate partially overlaps the orthographic projection of the light emitting control signal line 44 on the substrate.

Exemplarily, the light emitting control active layer 34 includes a part extending along the second direction. Exemplarily, a width of two end portions of the light emitting control active layer 34 in the first direction is greater than a width of a middle portion of the light emitting control active layer 34 between the two end portions in the first direction. Exemplarily, the orthographic projection of the middle portion of the light emitting control active layer 34 on the substrate at least partially overlaps the orthographic projection of the gate electrode of the light emitting control transistor T4 on the substrate, and the middle portion of the light emitting control active layer 34 is used to form a channel region of the light emitting control transistor T4.

The orthographic projection of the light emitting control active layer 34 on the substrate is located between the orthographic projections of the two anode patterns 80 included in the two subpixels on the substrate, so that the light emitting control transistor T4 is generally located between two subpixels in a group of subpixels, which not only ensures the good connection performance between the light emitting control transistor T4 and the light emitting control signal line 44, and the two driving sub-circuits, but also effectively reduces the layout difficulty of the light emitting control signal line 44 and the light emitting control transistor T4.

As shown in FIG. 3, FIG. 8, and FIG. 12, in some embodiments, the subpixels further include:

a power line VDD, the power line VDD includes a part extending along the first direction, and power lines VDD included in the two subpixels are coupled to each other;

A first electrode of the light emitting control transistor T4 is coupled to the power line VDD, and the light emitting control transistor T4 is configured to connect or disconnect the power line VDD and the driving sub-circuits in the two subpixels under the control of the light emitting control signal line 44.

Exemplarily, in the same group of subpixels, the power lines VDD included in the two subpixels are coupled to form an integrated structure.

Exemplarily, in the display substrate, the power lines VDD in all the subpixels located in the same column along the first direction are sequentially coupled to form an integrated structure.

Exemplarily, the power line VDD includes a positive power line, and the positive power line is used for providing a positive power signal Vd. The light emitting control transistor T4 is turned on or off under the control of the light emitting control signal EM provided by the light emitting control signal line 44, to control whether to transmit the power signal Vd provided by the power line VDD to the driving sub-circuit.

As shown in FIG. 3, FIG. 6, FIG. 8, FIG. 12 and FIG. 15, in some embodiments, the subpixels further include:

a power connection portion 45, the power connection portion 45 includes a part extending along the second direction; the two subpixel driving circuits 201 included in the two subpixels share the same power connection portion 45; an orthographic projection of the power line VDD on the substrate along the second direction is located on a side of the orthographic projection of the light emitting control active layer 34 on the substrate, and the first electrode of the light emitting control transistor T4 is coupled to the power line VDD through the power supply connection portion 45.

Exemplarily, the power connection portion 45 and the light emitting control active layer 34 are arranged at different layers, the power connection portion 45 and the power line VDD are arranged at different layers, and the power connection portion 45 is coupled to the first electrode of the light emitting control transistor T4 through the second conductive pattern 65, and the power supply connecting portion 45 is coupled to the power line VDD through a via hole that penetrates an insulating layer between the power connection portion 45 and the power line VDD.

Exemplarily, the power connection portion 45 and the light emitting control signal line 44 are arranged along the first direction.

The first electrode of the light emitting control transistor T4 is coupled to the power line VDD through the power connection portion 45, which not only ensures the connection performance between the light emitting control transistor T4 and the power line VDD, but also avoids the short circuit between the light emitting control transistor T4 and other conductive structures for connecting the power line VDD, and effectively reduces the layout difficulty of the light emitting control transistor T4.

Figure 6:
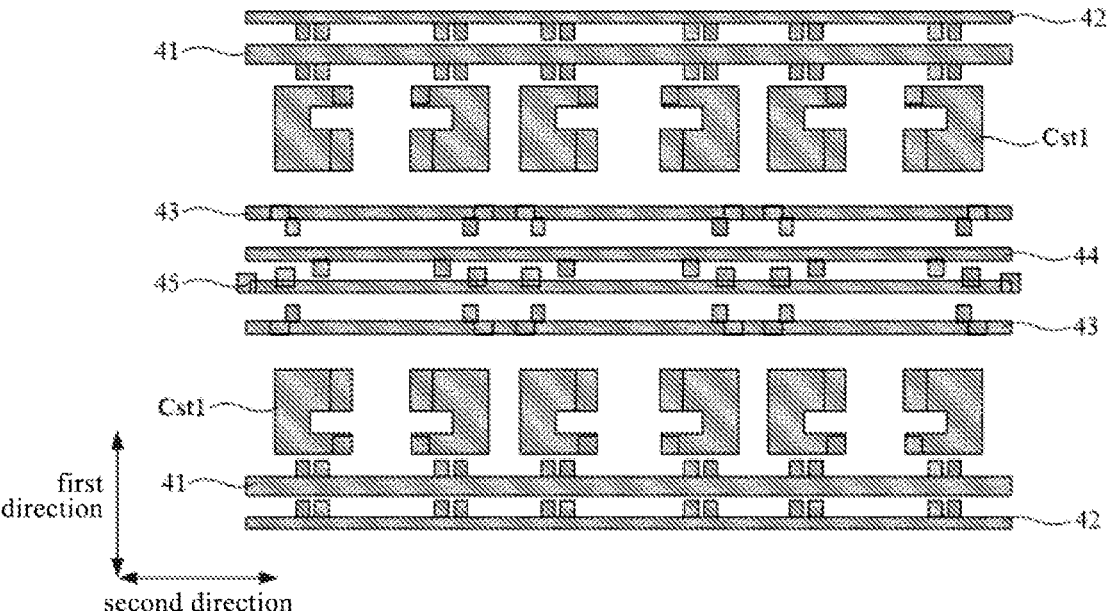
FIG. 6 is a schematic diagram of a layout of a first gate metal layer in FIG. 3.

As shown in FIG. 6, in some embodiments, the power connection portion 45 and the light emitting control signal line 44 are arranged at the same layer and made of the same material.

The above arrangement enables the power connection portion 45 and the light emitting control signal line 44 to be formed in the same patterning process, which effectively simplifies the manufacturing process of the display substrate and reduces the manufacturing cost of the display substrate.

Figure 14:
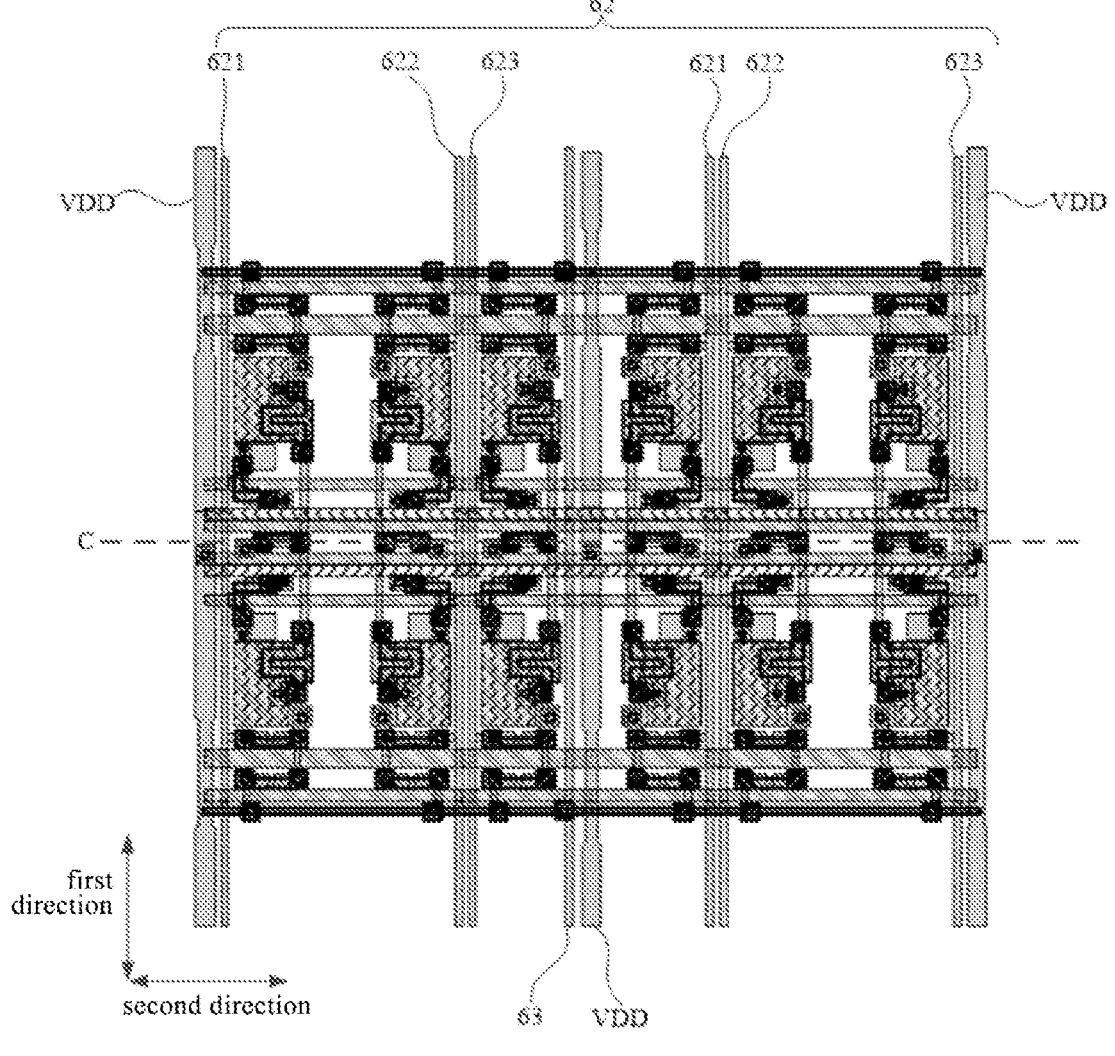
FIG. 14 is a schematic diagram of a layout by adding a first source-drain metal layer on the basis of FIG. 13.
Figure 15:
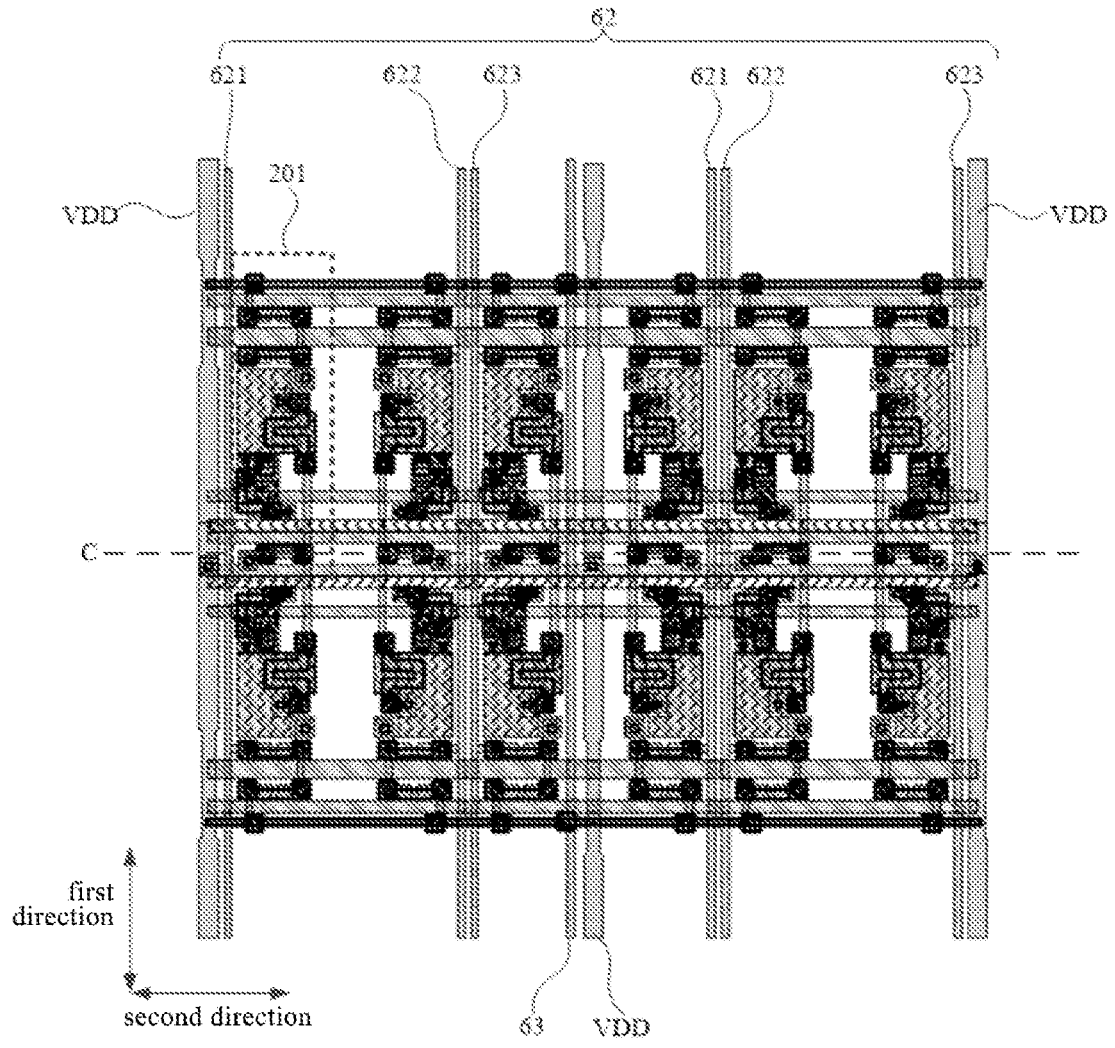
FIG. 15 is a schematic diagram of a layout by adding a second source-drain metal layer on the basis of FIG. 14.

As shown in FIG. 3, FIG. 6, and FIG. 14, in some embodiments, the plurality of subpixels are divided into a plurality of pixel units B, and the pixel unit B includes at least two subpixels arranged along the second direction; the at least two subpixels share the same power line VDD, and the power connection portions 45 included in the at least two subpixels are sequentially coupled.

Exemplarily, the plurality of subpixels are divided into a plurality of pixel units B, and the plurality of pixel units B are arranged in an array.

Exemplarily, the pixel unit B includes at least two sub-pixels arranged along the second direction; the at least two subpixels share the same power line VDD, and the power line VDD is located at a side of the at least two subpixels along the second direction.

Exemplarily, the power connection portions 45 included in the at least two subpixels are coupled in sequence to form an integrated structure. Exemplarily, in the pixel units B located in the same row along the second direction, the power connection portions 45 in the pixel units B are coupled in sequence to form an integrated structure.

The at least two subpixels share the same power line VDD, the power connection portions 45 included in the at least two subpixels are coupled in sequence, which not only realizes the coupling between each subpixel and the shared power supply line VDD through the power connection portion 45, but also effectively saves the layout space occupied by each subpixel, which is beneficial to improve the resolution of the display substrate.

Moreover, in the pixel units B located in the same row along the second direction, the power connection portions 45 in the pixel units B are sequentially coupled, so that the power line VDD and the power connection portion 45 in the display substrate are sequentially coupled to form a grid structure, which is beneficial to the overall uniformity of the power supply signal Vd.

As shown in FIG. 1, FIG. 3, FIG. 5, FIG. 8, and FIG. 12, in some embodiments, the driving sub-circuit includes a driving transistor T5, and the first electrode of the driving transistor T5 is coupled to the second electrode of the light emitting control transistor T4, the second electrode of the driving transistor T5 is coupled to the anode pattern 80 of the light emitting element;

The driving transistor T5 includes a driving active layer 35; in the two subpixel driving circuits 201, the driving active layers 35 included in the two driving transistors T5 are symmetrically arranged along an axis, and the symmetry axis C is extended along the second direction, an ortho-graphic projection of the symmetry axis C on the substrate is located between the orthographic projections of the two anode patterns 80 included in the two subpixels on the substrate.

Exemplarily, the first electrode of the driving transistor T5 is coupled to the second electrode of the light emitting control transistor T4 through the first conductive pattern 64, and the second electrode of the driving transistor T5 is coupled to the second electrode plate of the storage capacitor Cst, and is coupled to the anode pattern 80 through the second electrode plate Cst2. Exemplarily, the second elec-trode of the driving transistor T5 and the second electrode plate Cst2 of the storage capacitor Cst are arranged at different layers, and the second electrode of the driving transistor T5 is coupled to the second electrode plate Cst2 through the third conductive pattern 66.

Exemplarily, the driving active layer 35 includes a U-shaped portion and two end portions respectively extend-ing from two ends of the U-shaped portion. Exemplarily, the U-shaped portion is used to form the channel region of the driving transistor T5, and the two end portions are used as the first electrode and the second electrode of the driving transistor T5.

Exemplarily, in the two subpixel driving circuits 201 included in the same group of subpixels, the gate electrodes included in the two driving transistors T5 are arranged symmetrically about the symmetry axis C.

Exemplarily, the two driving active layers 35 included in the two adjacent subpixels along the second direction are symmetrical with respect to a longitudinal axis, and the longitudinal axis is located between the two driving active layers 35, the longitudinal axis extends along the first direction; the gate electrodes of the two driving transistors T5 included in the two adjacent subpixels along the second direction are symmetrical with respect to the longitudinal axis.

The above-mentioned symmetrical arrangement effec-tively reduces the layout space occupied by the subpixels, which is beneficial for the display substrate to achieve high resolution display.

Figure 5:
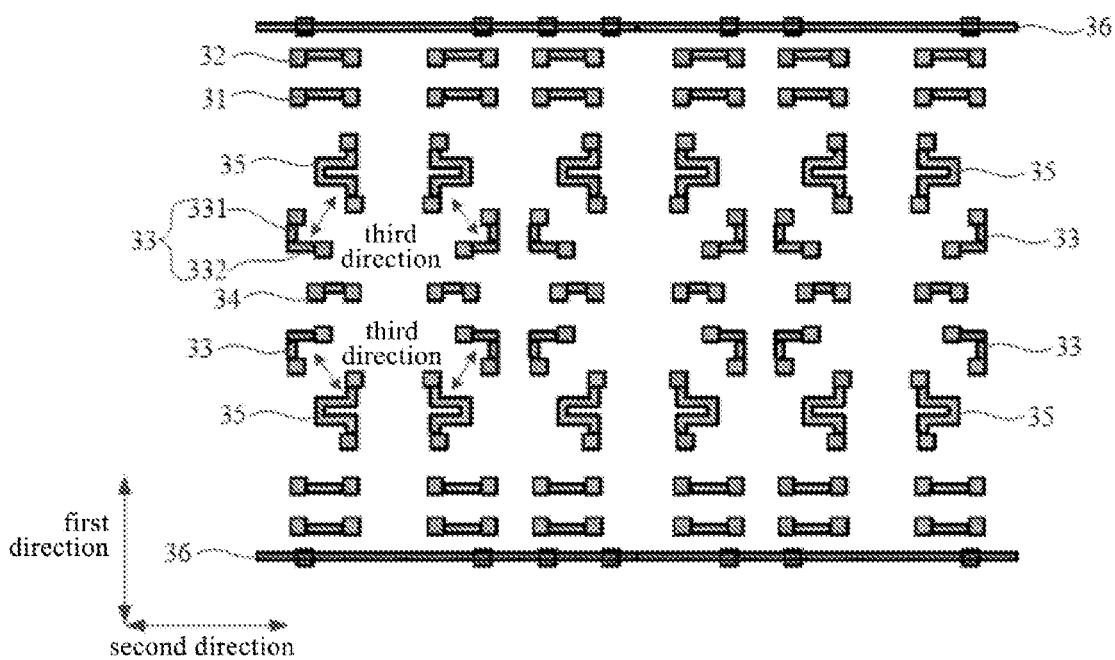
FIG. 5 is the schematic diagram of an active layer in FIG. 3.

As shown in FIGS. 3 and 5, in some embodiments, the orthographic projection of the symmetry axis C on the substrate overlaps the orthographic projection of the light emitting control active layer 34 on the substrate.

The above arrangement makes the light emitting control transistor T4 located at the center position of a group of subpixels along the first direction, which not only ensures the good connection performance between light emitting control transistor T4 and the light emitting control signal line 44, and the two driving sub-circuits, effectively reduces the layout difficulty of the light emitting control signal line 44 and the light emitting control transistor T4, and but also is beneficial to reduce the layout space occupied by the sub-pixels, and is beneficial to the display substrate to achieve high resolution display.

As shown in FIG. 1, FIG. 3, FIG. 5, FIG. 6, and FIG. 12, in some embodiments, the subpixel further includes a data line 62 and a first scan line 41, and the data line 62 includes a part extending along the first direction, the first scan line 41 includes a part extending along the second direction;

The subpixel driving circuit 201 further includes a first transistor T1, the gate electrode of the first transistor T1 is coupled to the first scan line 41, and the first electrode of the first transistor T1 is coupled to the data line 62, the second electrode of the first transistor T1 is coupled to the gate electrode of the driving transistor T5;

The first transistor T1 includes a first active layer 31, the first active layer 31 includes a part extending along the second direction; in the same subpixel, the first active layer 31, the driving active layer 35 and the light emitting control active layer 34 are sequentially arranged along the first direction.

Exemplarily, the data lines included in the subpixels located in the same column along the first direction are coupled in sequence to form an integrated structure. The first scan lines 41 included in the subpixels located in the same row along the second direction are sequentially coupled to form an integrated structure.

Exemplarily, the data line receives a data signal provided by a driving chip in the display substrate.

Exemplarily, the first scan line 41 is coupled to the corresponding gate driving circuit, and receives the first scan signal provided by the corresponding gate driving circuit.

Exemplarily, the first transistor T1 is turned on or off under the control of the first scan signal transmitted by the first scan line 41, so as to connect or disconnect the data line and the gate electrode of the driving transistor T5.

Exemplarily, the first active layer 31 includes a part extending along the second direction. Exemplarily, the width of the two end portions of the first active layer 31 in the first direction is greater than the width of the middle portion of the first active layer 31 located between the two end portions in the first direction. Exemplarily, the orthographic projec-tion of the middle portion of the first active layer 31 on the substrate at least partially overlaps the orthographic projec-tion of the gate electrode of the first transistor T1 on the substrate, and the middle portion of the first active layer 31 is used to form the channel region of the first transistor T1.

Exemplarily, the first active layer 31 and the data line are arranged at different layers, and the first active layer 31 and the gate electrode of the driving transistor T5 are arranged at different layers. The first electrode of the first transistor T1 is coupled to the data line through a via hole, and the via hole penetrates the insulating layer between the first electrode of the first transistor T1 and the data line. The second electrode of the first transistor T1 is respectively coupled to the gate electrode of the driving transistor T5 and the second electrode of the second transistor T2 through the sixth conductive connection portion.

Exemplarily, in one of the subpixels in the same group of subpixels, the first active layer 31, the driving active layer 35 and the light emitting control active layer 34 are sequentially arranged from above to below along the first direction. In another subpixel of the same group of subpixels, the first active layer 31, the driving active layer 35 and the light emitting control active layer 34 are sequentially arranged from above to below along the first direction.

As shown in FIG. 12, the above layout method enables the first transistor T1, the driving transistor T5 and the light emitting control transistor T4 to be arranged in sequence along the second direction, which is not only beneficial to reduce the layout difficulty of the subpixels, but also beneficial to reduce the layout space occupied by the subpixels, and beneficial to the display substrate to achieve high resolution display.

Figure 13:
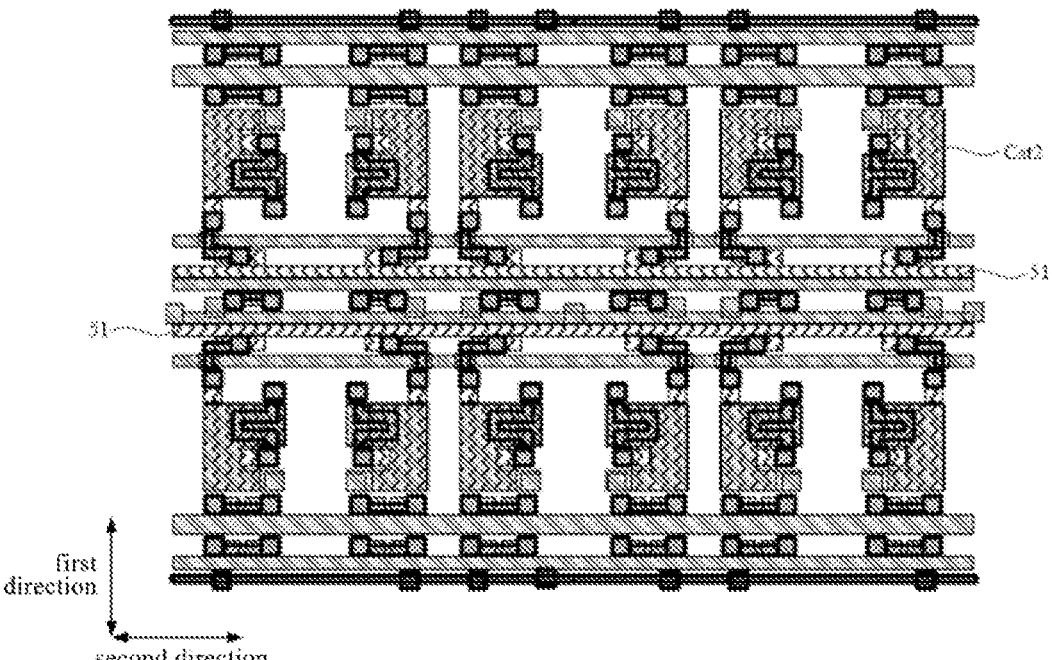
FIG. 13 is a schematic diagram of a layout of the active layer, the first gate metal layer and the second gate metal layer in FIG. 3.

As shown in FIG. 3, FIG. 5 and FIG. 13, in some embodiments, in the two subpixel driving circuits 201, the first active layers 31 included in the two first transistors T1 are symmetrically arranged with respect to the symmetry axis C.

The above arrangement effectively reduces the layout space occupied by the subpixels, which is beneficial for the display substrate to achieve high resolution display.

Figure 16:
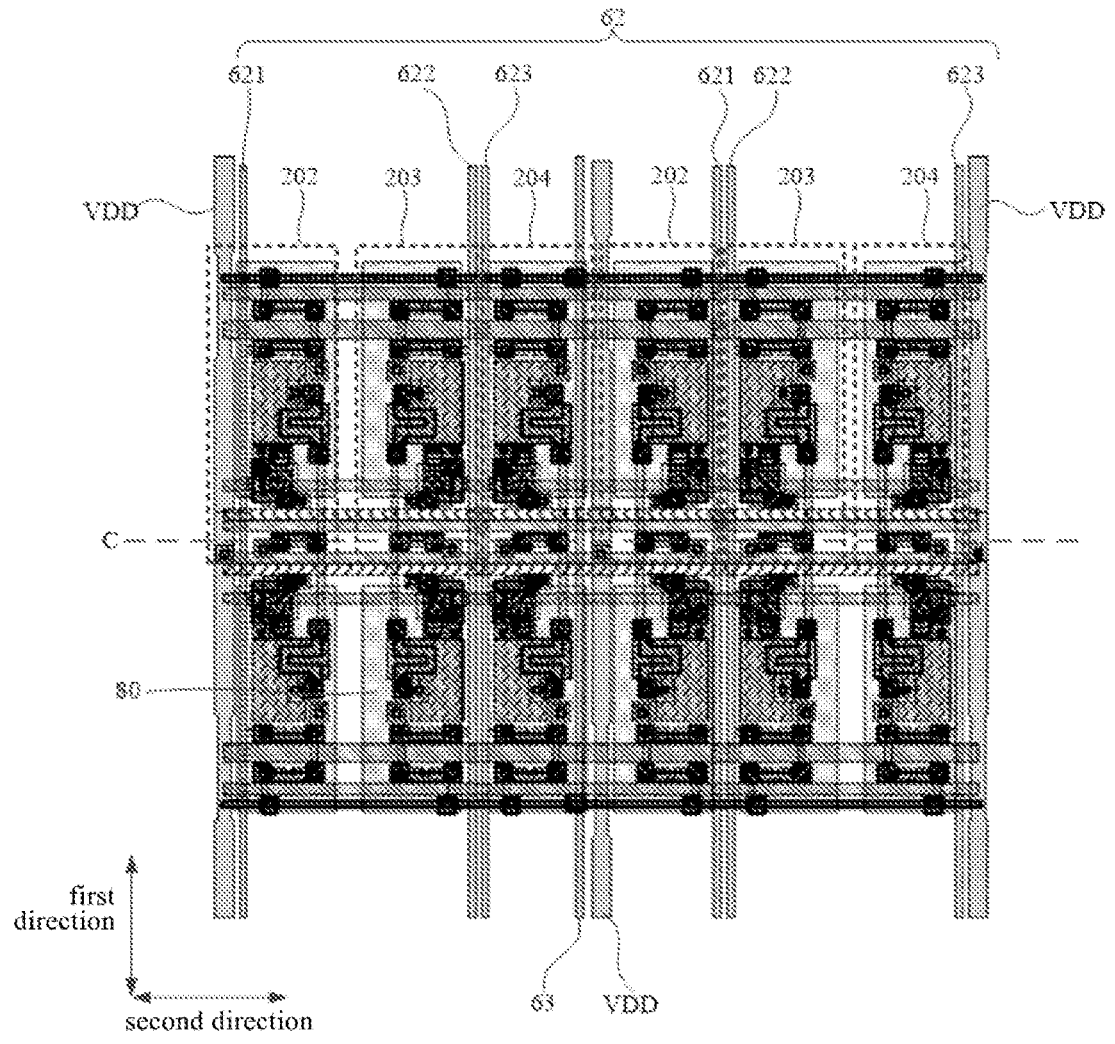
FIG. 16 is a schematic diagram of a layout by adding an anode layer on the basis of FIG. 15.

As shown in FIG. 3 and FIG. 16, in some embodiments, the plurality of subpixels are divided into a plurality of pixel units B, and at least some of the pixel units B include first subpixels 202, the second subpixel 203 and the third subpixel 204 arranged along the second direction, the first subpixel 202 includes a first data line 621, the second subpixel 203 includes a second data line 622, and the third subpixel 204 includes a third data line 623;

In a first part of pixel units B, the first data line 621 is located on a side of the first subpixel 202 away from the second subpixel 203 along the second direction, and the second data line 622 and the third data lines 623 are all located between the second subpixel 203 and the third subpixel 204; there is a first spacer region between the first subpixel 202 and the second subpixel 203;

In a second part of pixel units B, the first data line 621 and the second data line 622 are both located between the first subpixel 202 and the second subpixel 203, and the third data line 623 is located on a side of the third subpixel 204 away from the second subpixel 203 along the second direction; there is a second spacer region between the second subpixel 203 and the third subpixel 204.

Exemplarily, the pixel unit B includes a first subpixel 202, a second subpixel 203 and a third subpixel 204 arranged along the second direction, and four pixel units B form a smallest repeating unit. FIG. 3 shows the smallest repeating unit in the display substrate.

Exemplarily, the colors of the first subpixel 202, the second subpixel 203 and the third subpixel 204 are different from each other. Exemplarily, the first subpixel 202 includes a red subpixel, the second subpixel 203 includes a green subpixel, and the third subpixel 204 includes a blue subpixel. It should be noted that FIG. 1 shows red data signals DATAR1 and DATAR2 received by the red subpixels, green data signals DATAG1 and DATAG2 received by the green subpixels, and blue data signals DATAB1 and DATAB2 received by the blue subpixels.

Exemplarily, the first subpixel 202 includes a first subpixel driving circuit, the second subpixel 203 includes a second subpixel driving circuit, and the third subpixel 204 includes a third subpixel driving circuit.

Exemplarily, in the first part of pixel units B, the orthographic projection of the first data line 621 on the substrate is located on a side of the orthographic projection of the first subpixel driving circuit on the substrate away from the orthographic projection of the second subpixel driving circuit on the substrate along the second direction, the orthographic projection of the second data line 622 on the substrate and the orthographic projection of the third data line 623 on the substrate are both located between the orthographic projection of the second subpixel driving circuit on the substrate and the orthographic projection of the third subpixel driving circuit on the substrate.

Exemplarily, in the second part of the pixel units B, the orthographic projection of the first data line 621 on the substrate and the orthographic projection of the second data line 622 on the substrate are both located between the orthographic projection of the first subpixel driving circuit on the substrate and the orthographic projection of the second subpixel driving circuit on the substrate, the orthographic projection of the third data line 623 on the substrate is located on a side of the orthographic projection of the third subpixel driving circuit on the substrate away from the orthographic projection of the second subpixel driving circuit on the substrate along the second direction.

Exemplarily, the orthographic projection of the first spacer region on the substrate is located between the orthographic projection of the first subpixel driving circuit on the substrate and the orthographic projection of the second subpixel driving circuit on the substrate.

Exemplarily, the orthographic projection of the first spacer region on the substrate is located between the orthographic projection of the anode pattern 80 included in the first subpixel 202 on the substrate and the orthographic projection of the anode pattern 80 included in the second subpixel 203 on the substrate.

Exemplarily, the orthographic projection of the second spacer region on the substrate is located between the orthographic projection of the second subpixel driving circuit on the substrate and the orthographic projection of the third subpixel driving circuit on the substrate.

Exemplarily, the orthographic projection of the second spacer region on the substrate is located between the orthographic projection of the anode pattern 80 included in the second subpixel 203 on the substrate and the orthographic projection of the anode pattern 80 included in the second subpixel 203 on the substrate.

The above layout method effectively reduces the layout space occupied by the subpixels, which is beneficial for the display substrate to achieve high resolution display.

Figure 4:
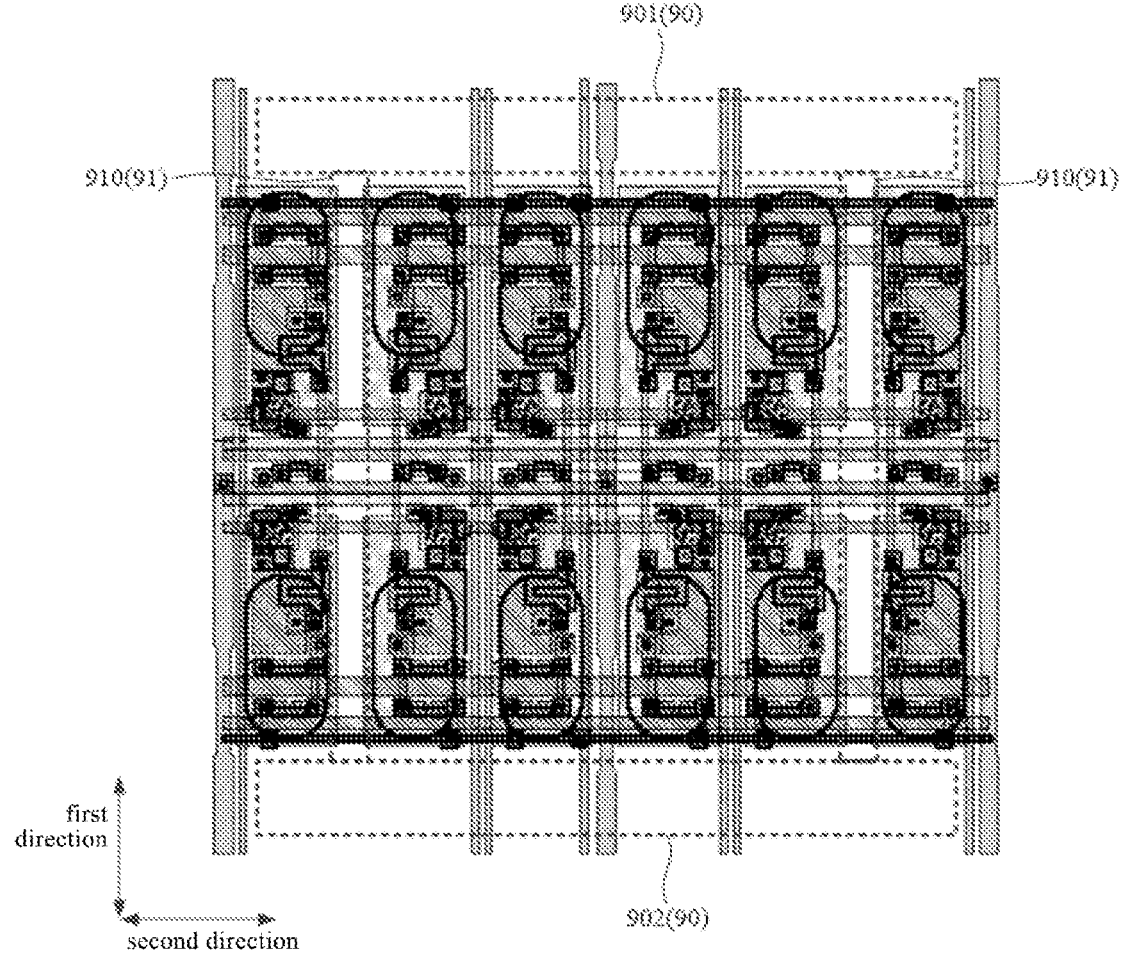
FIG. 4 is a schematic diagram of a gate driving circuit layout area and a gate driving wiring layout area provided by an embodiment of the present disclosure.

As shown in FIG. 3, FIG. 4, and FIG. 16, in some embodiments, the plurality of groups of subpixels are divided into a plurality of rows of subpixel groups arranged along the first direction, and each row of subpixel groups include a plurality of groups of subpixels arranged in the second direction;

The display substrate further includes a plurality of gate driving circuit layout areas 90 and a plurality of gate driving wiring layout areas 91;

The plurality of gate driving circuit layout areas 90 are in one-to-one correspondence with the plurality of rows of subpixel groups, and each gate driving circuit layout area 90 includes a first layout area 901 and a second layout area 902. Along the first direction, the first layout area 901 is located on the first side of the corresponding row of subpixel groups, and the second layout area 902 is located on the second side of the corresponding row of subpixel groups;

The plurality of gate driving circuit layout areas 90 correspond to the plurality of gate driving wiring layout areas 91 in a one-to-one manner, and the gate driving wiring layout areas 91 include at least two third layout areas 910 arranged along the second direction;

Among the at least two third layout areas 910, at least one third layout area 910 is located in the first spacer region in a corresponding row of subpixel groups; the at least one third layout area 910 is located in the second spacer region in a corresponding row of the subpixel groups.

Exemplarily, the gate driving circuit layout area 90 is used for layout of gate driving circuit, the gate driving wiring layout area 91 is used for layout of the gate driving wiring, and the gate driving wiring is coupled to the corresponding gate driving circuit, and configured to provide a corresponding signal to the gate driving circuit, or transmit a signal provided by the gate driving circuit to the subpixel.

Exemplarily, the first layout area 901 and the second layout area 902 both extend along the second direction, and the third layout area 910 extends along the first direction.

Exemplarily, along the first direction, the first layout area 901 is located on a first side of a corresponding row of subpixel groups, and the second layout area 902 is located on a second side of a corresponding row of subpixel groups, the first side and the second side are opposite along the first direction.

Exemplarily, the plurality of gate driving circuit layout areas 90 are in one-to-one correspondence with the plurality of gate driving wiring layout areas 91, and the gate driving wiring layout area 91 includes at least two third layout areas 910 arranged along the second direction. The at least two third layout areas 910 are located between the corresponding first layout areas 901 and the second layout areas 902.

The above method enables both the gate driving circuit and the gate driving wiring to be laid out in the display area, and the layout of the gate driving circuit and the gate driving wiring is optimized and is well compatible with GOA logic resources and provides technical support for the realization of high-resolution GIA display for special-shaped display products.

As shown in FIG. 1, FIG. 3, FIG. 5, FIG. 6, and FIG. 12, in some embodiments, the subpixel further includes a reference signal line 63 and a second scan line 42, and the reference signal line 63 includes a part extending along the first direction, the second scan line 42 includes a part extending along the second direction;

The subpixel driving circuit 201 further includes a second transistor T2, the gate electrode of the second transistor T2 is coupled to the second scan line 42, the first electrode of the second transistor T2 is coupled to the reference signal line 63, and the second electrode of the second transistor T2 is coupled to the gate electrode of the driving transistor T5;

The second transistor T2 includes a second active layer 32, and the second active layer 32 includes a part extending along the second direction; in the same subpixel, the second active layer 32, the first active layer 31 and the light emitting control active layer 34 are sequentially arranged along the first direction.

Exemplarily, the reference signal lines 63 included in the same column of subpixels along the first direction are coupled in sequence to form an integrated structure. The second scan lines 42 included in the same row of subpixels along the second direction are coupled in sequence to form an integrated structure.

Exemplarily, the reference signal line 63 is used to provide the reference signal Vref.

Exemplarily, the second scan line 42 is coupled to a corresponding gate driving circuit and receives a second scan signal provided by the corresponding gate driving circuit.

Exemplarily, the second transistor T2 is turned on or off under the control of the second scan signal transmitted by the second scan line 42, so as to connect or disconnect the reference signal line 63 and the gate electrode of the drive transistor T5.

Exemplarily, the second active layer 32 includes a part extending along the second direction. Exemplarily, the width of the two end portions of the second active layer 32 in the first direction is greater than the width of the middle portion of the second active layer 32 between the two end portions in the first direction. Exemplarily, the orthographic projection of the middle portion of the second active layer 32 on the substrate at least partially overlaps the orthographic projection of the gate electrode of the second transistor T2 on the substrate, and the middle portion of the second active layer 32 is used to form the channel region of the second transistor T2.

Exemplarily, in one subpixel in the same group of subpixels, the second active layer 32, the first active layer 31 and the light emitting control active layer 34 are sequentially arranged from above to below along the first direction. In another subpixel of the same group of subpixels, the second active layer 32, the first active layer 31 and the light emitting control active layer 34 are sequentially arranged from above to below along the first direction.

The above layout method enables the second transistor T2, the first transistor T1 and the light emitting control transistor T4 to be sequentially arranged along the second direction, which not only reduces the layout difficulty of the subpixels, but also reduces the layout space occupied by the subpixels, and beneficial for the display substrate to achieve high resolution display.

As shown in FIG. 3 and FIG. 5, in some embodiments, in the two subpixel driving circuits 201, the second active layers 32 included in the two second transistors T2 are symmetrically arranged with respect to the symmetry axis C.

The above arrangement effectively reduces the layout space occupied by the subpixels, which is beneficial for the display substrate to achieve high resolution display.

As shown in FIG. 5, FIG. 12, and FIG. 14, in some embodiments, the subpixel further includes a reference connection portion 36, and the reference connection portion 36 includes a part extending along the second direction; the first electrode of the second transistor T2 is coupled to the reference signal line 63 through the reference connection portion 36.

Exemplarily, the reference connection portion 36 and the second active layer 32 are arranged at the same layer and made of the same material, the reference connection portion 36 and the reference signal line 63 are arranged at different layers, and the reference connection portion 36 is coupled to the first electrode of the second transistor T2 through the fourth conductive pattern 67, and the reference connection portion 36 is coupled to the reference signal line 63 through a via hole, the via hole penetrates the insulating layer between the reference connection portion 36 and the reference signal line 63.

Exemplarily, in the same group of subpixels, the two reference connection portions 36 included in the two subpixels are symmetrically arranged with respect to the symmetry axis C.

The above-mentioned setting of the first electrode of the second transistor T2 to be coupled to the reference signal line 63 through the reference connection portion 36 not only ensures the connection performance between the second transistor T2 and the reference signal line 63, which prevents the second transistor T2 from being short-circuited with other conductive structures for connecting to the reference signal line 63, and but also effectively reduces the layout difficulty of the second transistor T2.

As shown in FIG. 5, FIG. 12, FIG. 14, and FIG. 17, in some embodiments, the plurality of subpixels are divided into a plurality of pixel units B, and the pixel unit B includes at least two subpixels arranged along the second direction; subpixels included in two adjacent pixel units B arranged along the second direction share one reference signal line 63, and the reference signal line 63 is located between the two adjacent pixel units B, the reference connection portions 36 included in the subpixels are sequentially coupled.

Exemplarily, the orthographic projection of the reference signal line 63 on the substrate overlaps the orthographic projection of an anode pattern 80 included in an adjacent pixel unit B on the substrate, and does not overlap the orthographic projection of any anode pattern 80 included in adjacent another pixel unit B on the substrate.

Exemplarily, the reference connection portions 36 included in the subpixels are coupled in sequence to form an integrated structure. Exemplarily, in the same row of pixel units B along the second direction, the power connection portions 45 in the pixel units B are coupled in sequence to form an integrated structure.

The subpixels included in the two adjacent pixel units B arranged along the second direction share one reference signal line 63, and the reference connection portions 36 included in the subpixels are coupled in sequence, which not only realizes the coupling between each subpixel and the shared reference signal line 63 through the reference connection portion 36, but also effectively saves the layout space occupied by each subpixel, and is beneficial to improve the resolution of the display substrate.

Moreover, in the same row of pixel units B along the second direction, the reference connection portions 36 in the pixel units B are sequentially coupled, so that the reference signal line 63 in the display substrate and the reference connection portion 36 can form a grid structure, which is beneficial to the overall uniformity of the reference signal Vref.

As shown in FIG. 12, in some embodiments, in the same subpixel, the orthographic projection of the reference connecting portion 36 on the substrate, the orthographic projection of the second scan line 42 on the substrate, the orthographic projection of the first scan line 41 on the substrate, and the orthographic projection of the light emitting control signal line 44 on the substrate are sequentially arranged along the first direction.

The above arrangement not only effectively reduces the layout space occupied by the subpixels, facilitates the display substrate to achieve high resolution display, but also facilitates to reduce the layout difficulty of the subpixels.

As shown in FIG. 1, FIG. 3, FIG. 5, FIG. 6, FIG. 7, FIG. 10, and FIG. 18, in some embodiments, the subpixel further includes an initialization signal line 51 and a third scan line 43. Each of the initialization signal line 51 and the third scan line 43 includes a part extending along the second direction;

The subpixel driving circuit 201 further includes a third transistor T3, the gate electrode of the third transistor T3 is coupled to the third scan line 43, and the first electrode of the third transistor T3 is connected to the initialization signal line 51, and the second electrode of the third transistor T3 is coupled to the anode pattern 80 of the light emitting element;

The third transistor T3 includes a third active layer 33; in the same subpixel, the first active layer 31, the third active layer 33 and the light emitting control active layer 34 are sequentially arranged along the first direction.

Exemplarily, the initialization signal line 51 includes a part extending along the second direction, and the initialization signal lines 51 included in the same row of subpixels along the second direction are sequentially coupled to form an integrated structure.

Exemplarily, the initialization signal line 51 is used to provide the initialization signal Vinit.

Exemplarily, the third scan line 43 includes a part extending along the second direction, and the third scan lines 43 included in the same row of subpixels along the second direction are sequentially coupled to form an integrated structure.

Exemplarily, the third scan line 43 is coupled to a corresponding gate driving circuit, and receives a third scan signal provided by the corresponding gate driving circuit.

Exemplarily, the third transistor T3 is turned on or off under the control of the third scan signal transmitted by the third scan line 43, so as to connect or disconnect the initialization signal line 51 and the first electrode of the third transistor T3.

Exemplarily, the third active layer 33 and the initialization signal line 51 are arranged at different layers, and the third active layer 33 and the third scan line 43 are arranged at different layers. The first electrode of the third transistor T3 is coupled to the initialization signal line 51 through the fifth conductive pattern 68, and the second electrode of the third transistor T3 is connected to the second electrode plate Cst2 of the storage capacitor Cst through the first conductive connection portion 60.

In the above arrangement, in the same subpixel, the first active layer 31, the third active layer 33 and the light emitting control active layer 34 are arranged in sequence along the first direction, which effectively reduces the layout space occupied by the subpixel, which is conducive for the display substrate to realize the high resolution display, and is also conducive to reducing the layout difficulty of the subpixels.

As shown in FIG. 3 and FIG. 5, in some embodiments, in the two subpixel driving circuits 201, the third active layers 33 included in the two third transistors T3 are symmetrically arranged with respect to the symmetry axis C.

The above arrangement effectively reduces the layout space occupied by the subpixels, which is beneficial for the display substrate to achieve high resolution display.

As shown in FIG. 5, FIG. 6, and FIG. 12, in some embodiments, at least one of the first transistor T1, the second transistor T2 and the third transistor T3 includes a double gate structure.

Exemplarily, the first transistor T1, the second transistor T2, the third transistor T3, the light emitting control transistor T4 and the driving transistor T5 are all N-type low temperature polysilicon transistors.

The above arrangement of the first transistor T1, the second transistor T2 and the third transistor T3 includes a double gate structure, which is beneficial to reduce the leakage current of the transistors and ensure the functional accuracy and operation stability of the subpixel driving circuit 201.

As shown in FIG. 1, FIG. 3, FIG. 6, FIG. 7, FIG. 10, and FIG. 16, in some embodiments, the subpixel driving circuit 201 further includes a storage capacitor Cst, and the storage capacitor Cst includes a first electrode plate Cst1 and a second electrode plate Cst2 arranged oppositely, the first electrode plate Cst1 is located between the substrate and the second electrode plate Cst2; the first electrode plate Cst1 is coupled to the gate electrode of the driving transistor T5, the second electrode plate Cst2 is respectively coupled to the second electrode of the driving transistor T5 and the anode pattern 80 of the light emitting element; in the two subpixel driving circuits 201, the two first electrode plates Cst1 are symmetrically arranged with respect to the symmetry axis C; and/or, the two second electrode plates Cst2 are symmetrically arranged with respect to the symmetry axis C.

Exemplarily, the first electrode plate Cst1 is multiplexed as the gate electrode of the driving transistor T5.

Exemplarily, the second electrode plate Cst2 is coupled to the second electrode of the driving transistor T5 through the third conductive pattern 66.

Exemplarily, the orthographic projection of the second electrode plate Cst2 on the substrate at least partially overlaps the orthographic projection of the driving active layer 35 on the substrate.

Exemplarily, the orthographic projection of the second electrode plate Cst2 on the substrate is located between the orthographic projection of the first active layer 31 on the substrate and the orthographic projection of the third active layer 33 on the substrate.

Exemplarily, the orthographic projection of the first electrode plate Cst1 on the substrate is located between the orthographic projection of the first active layer 31 on the substrate and the orthographic projection of the third active layer 33 on the substrate.

In the above setting of the two subpixel driving circuits 201, the two first electrode plates Cst1 are symmetrically arranged with respect to the symmetry axis C; and/or, the two second electrode plates Cst2 are symmetrically arranged with respect to the symmetry axis C, which can effectively reduce the layout space occupied by the subpixels, which is beneficial for the display substrate to achieve high resolution display.

As shown in FIG. 8, FIG. 9, FIG. 10, FIG. 12, FIG. 13, and FIG. 18 to FIG. 21, in some embodiments, the subpixel further includes a first conductive connection portion 60 and a second conductive connection portion 70 arranged at different layers, the first conductive connection portion 60 is located between the substrate and the second conductive connection part 70, the anode pattern 80 is located on a side of the second conductive connection portion 70 away from the substrate;

the second electrode plate Cst2 is coupled to the first conductive connection portion 60;

There is a first overlapping area between the orthographic projection of the second conductive connection portion 70 on the substrate 10 and the orthographic projection of the first conductive connection portion 60 on the substrate 10, and there is a second overlapping area between the orthographic projection of the second conductive connection portion 70 on the substrate 10 and the orthographic projection of the anode pattern 80 on the substrate 10;

The second conductive connection portion 70 is coupled to the first conductive connection portion 60 through a first via hole Via1, and the orthographic projection of the first via hole Via1 on the substrate 10 is located in the first overlapping area; the second conductive connection portion 70 is coupled to the anode pattern 80 through a second via hole Via2, and the orthographic projection of the second via hole Via2 on the substrate 10 is located in the second overlapping area.

Exemplarily, the first conductive connection portion 60 is respectively coupled to the second electrode plate Cst2, the second electrode of the third transistor T3 and the second conductive connection portion 70.

Exemplarily, the first via hole Via1 penetrates an insulating layer located between the first conductive connection portion 60 and the second conductive connection portion 70, and the second via hole Via2 penetrates an insulating layer located between the second conductive connection portion 70 and the anode pattern 80.

In the above arrangement, the second electrode plate Cst2 is coupled to the anode pattern 80 through the first conductive connection portion 60 and the second conductive connection portion 70, so that the depths of the first via hole Via1 and the second via hole Via2 are all shallow, and the first via holes Via1 and the second via holes Via2 can be staggered to form a stepped hole with a gentle slope, which avoids to form a deeper hole between the second electrode plate Cst2 and the anode pattern 80, which effectively reduces the risk of the anode pattern 80 being broken at the second via hole Via2.

Figure 17:
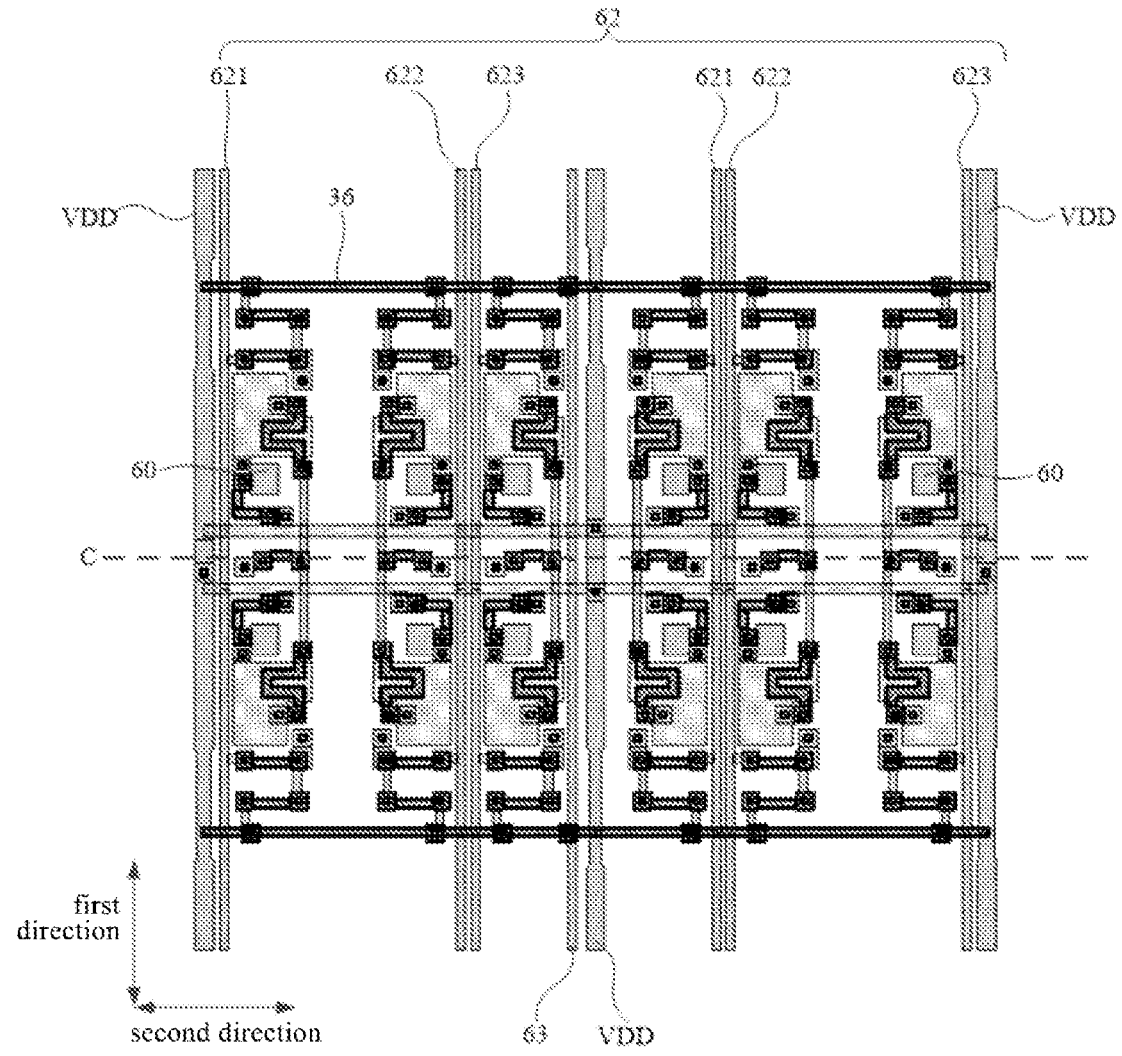
FIG. 17 is a schematic diagram of a layout of the active layer, the second gate metal layer and the first source-drain metal layer in FIG. 3.
Figure 18:
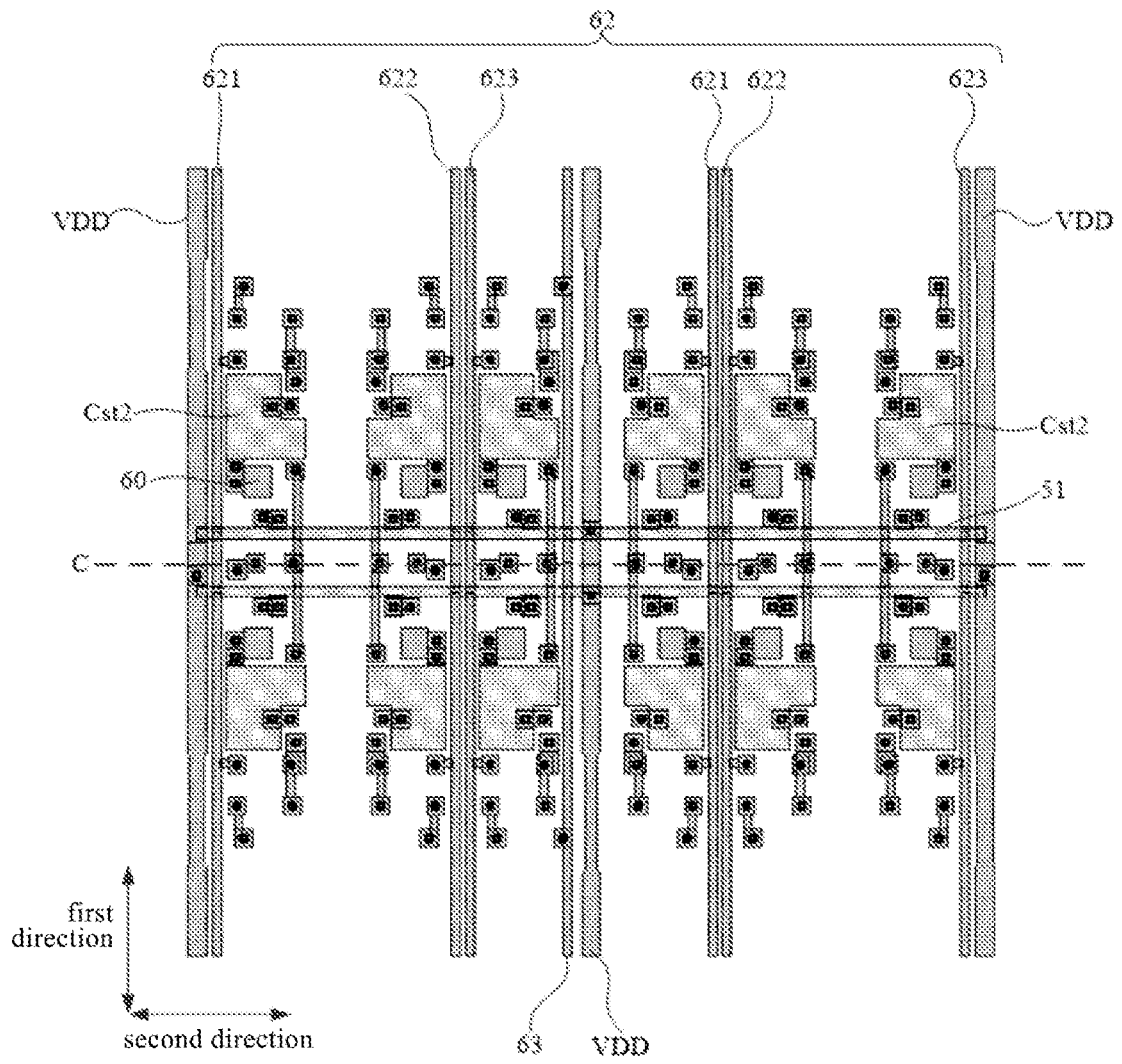
FIG. 18 is a schematic diagram of a layout of the second gate metal layer and the first source-drain metal layer in FIG. 3.
Figure 19:
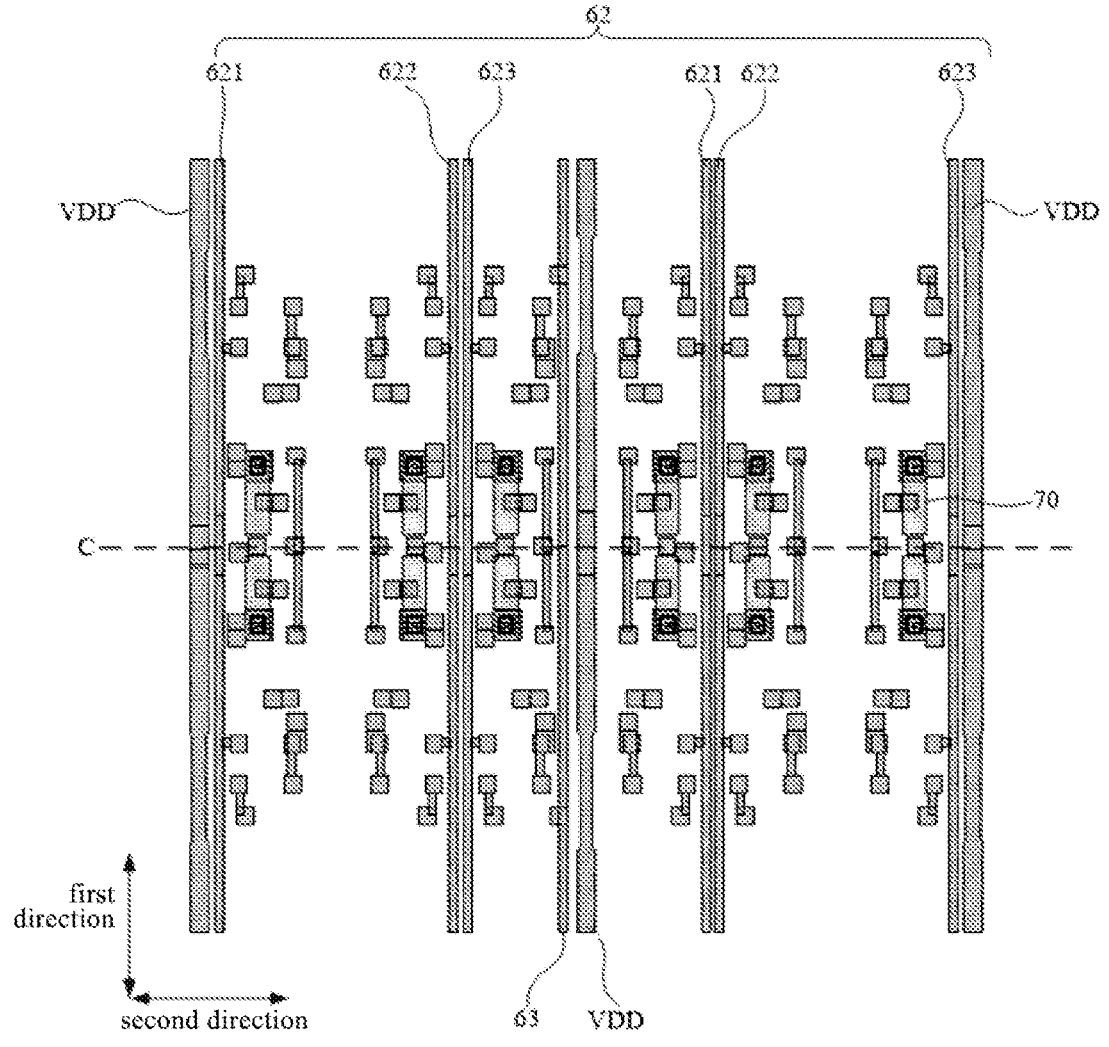
FIG. 19 is a schematic diagram of a layout of the first source-drain metal layer and the second source-drain metal layer in FIG. 3.
Figure 20:
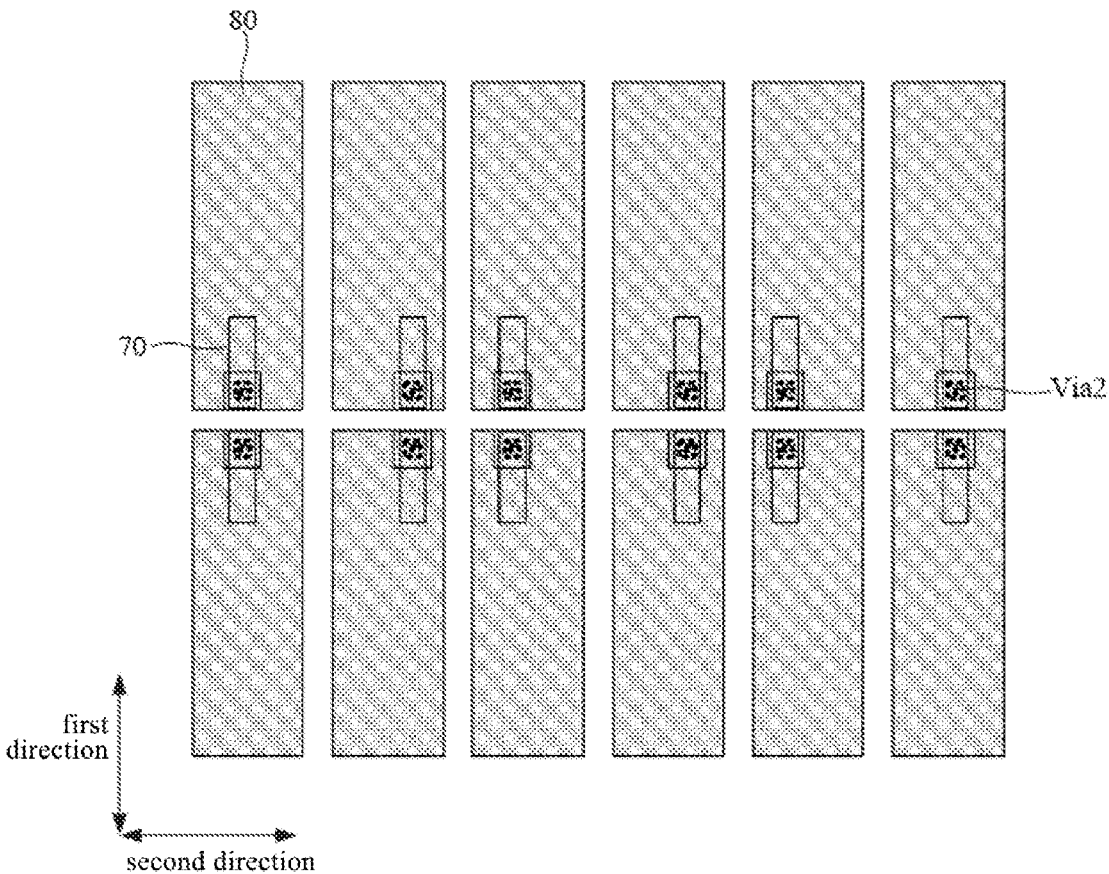
FIG. 20 is a schematic diagram of a layout of the second source-drain metal layer and the anode layer in FIG. 3.
Figure 21:
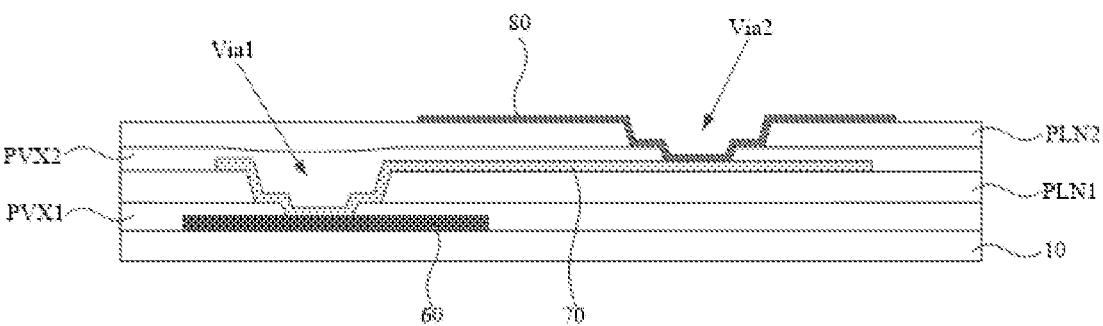
FIG. 21 is a schematic cross-sectional view of a first via hole and a second via hole according to an embodiment of the present disclosure.

As shown in FIG. 5 and FIG. 17, in some embodiments, at least part of the orthographic projection of the first conductive connection portion 60 on the substrate is located between the orthographic projection of the third active pattern on the substrate and the orthographic projection of the driving active layer 35 on the substrate.

The above arrangement effectively reduces the layout space occupied by the subpixels, which is beneficial to reduce the layout difficulty of the subpixels and improve the resolution of the display substrate.

As shown in FIG. 5, in some embodiments, the third active layer 33 includes a first portion 331 and a second portion 332 coupled to each other, and the first portion 331 includes a part extending along the first direction, the second portion 332 includes a part extending along the second direction, the first portion 331 and the second portion 332 are formed into an L-shaped structure; in the same subpixel, the third active layer 33 and the driving active layer 35 are arranged along a third direction, and the third direction intersects both the first direction and the second direction; the 90-degree angle of the L-shaped structure faces the driving active layer 35.

Exemplarily, the orthographic projection of the first portion 331 on the substrate and the orthographic projection of the second portion 332 on the substrate are partially overlap of the orthographic projection of the gate electrode of the third transistor T3 on the substrate, so that the third transistor T3 is formed into a double gate structure.

Exemplarily, the first direction is perpendicular to the second direction, and an included angle between the third direction and the first direction is between 30 degrees and 45 degrees, which may include endpoint values.

The above arrangement effectively reduces the layout space occupied by the subpixels, which is beneficial to reduce the layout difficulty of the subpixels and improve the resolution of the display substrate.

In some embodiments, the display substrate further includes a data fan-out line arranged on the substrate, the data fan-out line is coupled to a corresponding data line, and the data fan-out line and the second conductive connection portion 70 are arranged at the same layer and made of the same material.

Exemplarily, the display substrate includes a plurality of data fan-out lines, one end of the data fan-out line is coupled to the corresponding data line, and the other end of the data fan-out line is coupled to the corresponding pin in the driver chip, the data fan-out line is used to transmit the data signal provided by the driver chip to the corresponding data line.

Exemplarily, the display substrate includes an active layer, a first gate insulating layer, a first gate metal layer, a second gate insulating layer, a second gate metal layer, an interlayer insulating layer, a first source-drain metal layer, a first passivation layer PVX1, a first planarization layer PLN1, a second source-drain metal layer, a second passivation layer PVX2, a second planarization layer PLN2, an anode layer, a pixel defining layer, a light emitting functional layer, a cathode layer, a encapsulation structure that are sequentially stacked along a direction away from the substrate. Exemplarily, the display substrate may also not include the first passivation layer PVX1 and/or the second passivation layer PVX2.

Exemplarily, the second source-drain metal layer includes the data fan-out line and the second conductive connection portion 70.

Exemplarily, the thickness of the data fan-out line is about 5500 angstroms.

Exemplarily, in a display substrate with a special-shaped design, the data fan-out line is arranged in the display area, that is, Fanout In AA (FIA) technology is used.

The second source-drain metal layer includes the data fan-out line and the second conductive connection portion 70, so that there are at least the first passivation layer PVX1 and the first planarization layer PLN1 between the data fan-out line and a conductive structure below the data fan-out line, thereby effectively reducing the RC Loading generated by the data fan-out line.

In more detail, the display substrate is formed through 12 patterning processes (Mask process), which specifically include: a patterning process of the active layer, a patterning process of the first gate metal layer, a patterning process of the second gate metal layer, a patterning process of the interlayer insulating layer, a patterning process of the first source-drain metal layer, a patterning process of the first planarization layer PLN1, a patterning process of the first passivation layer PVX1, a patterning process of the second source-drain metal layer, a patterning process of the second planarization layer PLN2, a patterning process of the second passivation layer PVX2, a patterning process of the anode layer and a patterning process of the pixel defining layer.

As shown in FIG. 5, exemplarily, the active layer includes the driving active layer 35, the light emitting control active layer 34, the first active layer 31, and the second active layer 32, the third active layer 33 and the reference connection portion 36.

As shown in FIG. 6, exemplarily, the first gate metal layer includes the gate electrode of the driving transistor T5, the gate electrode of the light emitting control transistor T4, the gate electrode of the first transistor T1, the gate electrode of the second transistor T2, the gate electrode of the third transistor T3, the first scan line 41, the second scan line 42, the third scan line 43, the light emitting control signal line 44 and the power connection portion 45.

Figure 7:
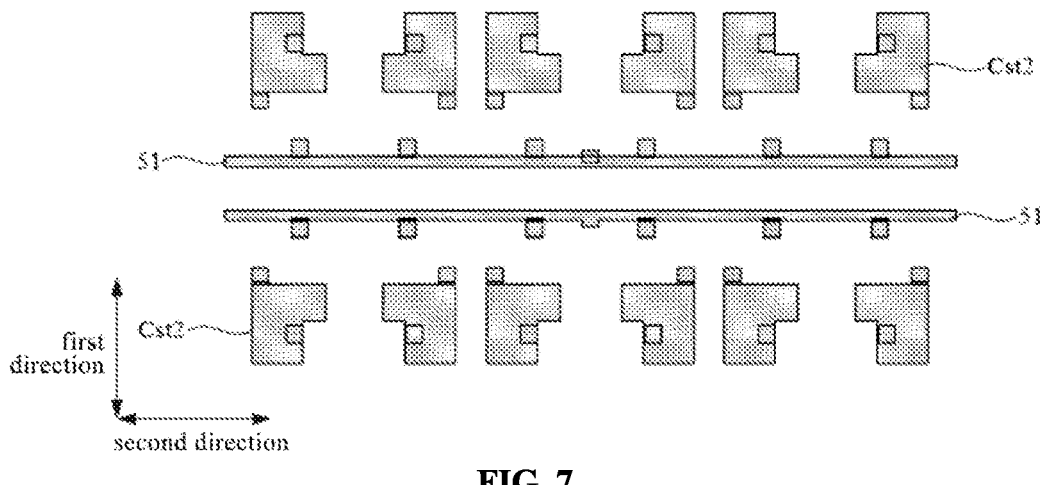
FIG. 7 is a schematic diagram of a layout of a second gate metal layer in FIG. 3.

As shown in FIG. 7, exemplarily, the second gate metal layer includes a second electrode plate Cst2 of the storage capacitor Cst and the initialization signal line 51.

As shown in FIG. 8, exemplarily, the first source-drain metal layer includes a power line VDD, a data line, a reference signal line 63, a first conductive connection portion 60, and a first conductive pattern 64 to a sixth conductive pattern 69.

Figure 9:
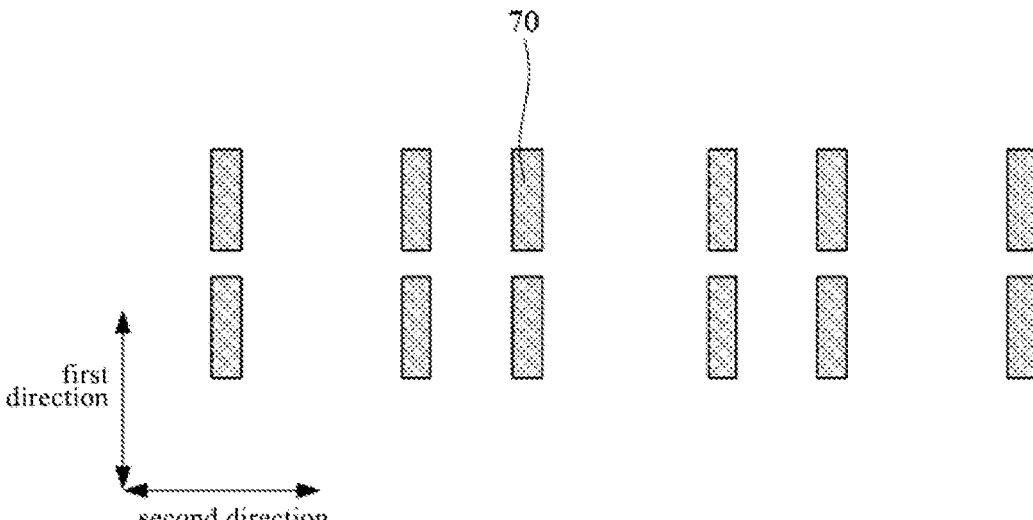
FIG. 9 is a schematic diagram of a layout of a second source-drain metal layer in FIG. 3.

As shown in FIG. 9, exemplarily, the second source-drain metal layer includes a second conductive connection portion 70 and a data fan-out line.

Figure 10:
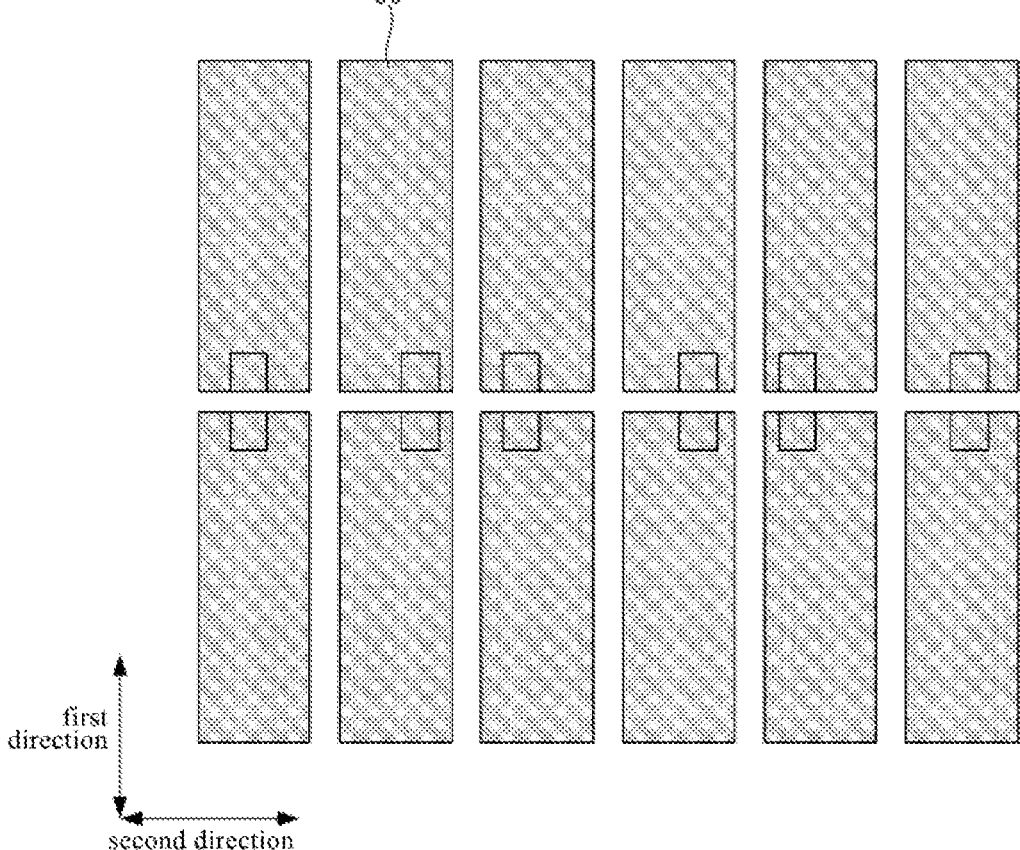
FIG. 10 is the schematic diagram of a layout of an anode layer in FIG. 3.

As shown in FIG. 10, exemplarily, the anode layer exemplarily includes an anode pattern 80.

Figure 11:
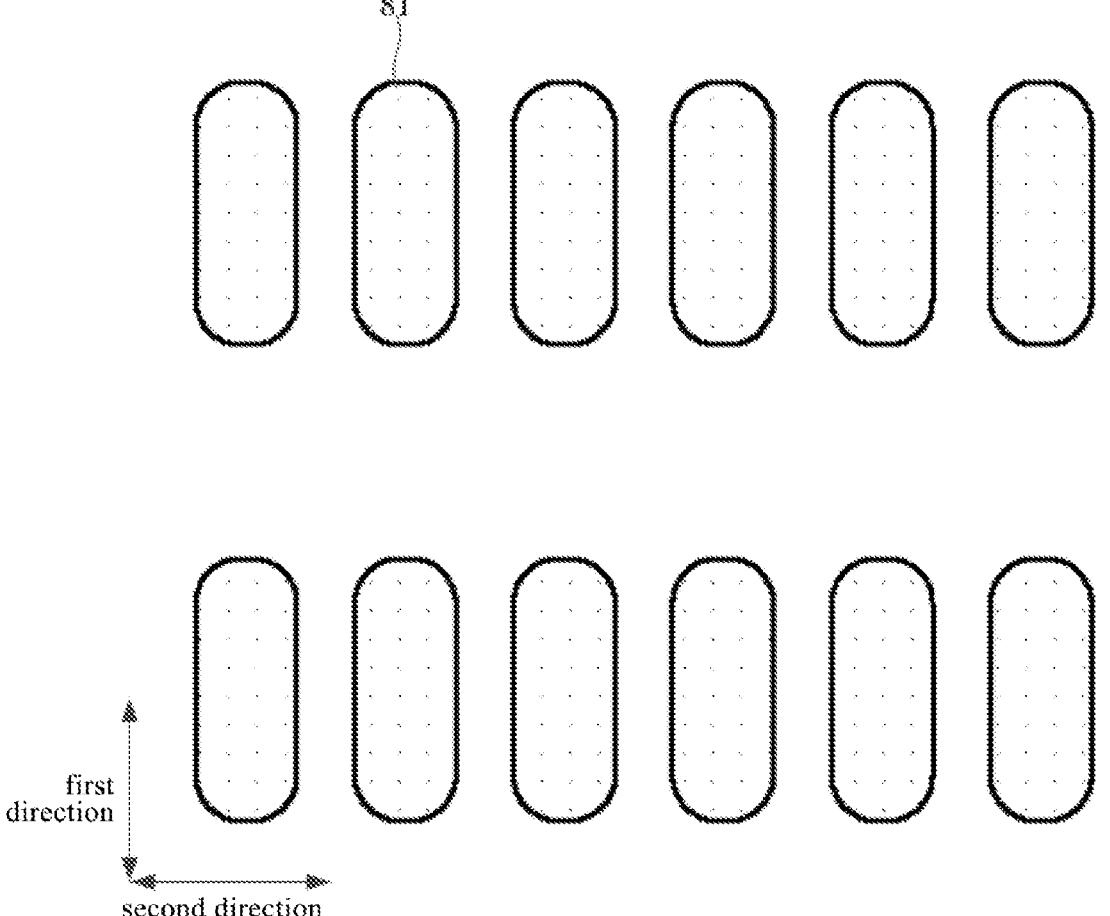
FIG. 11 is a schematic diagram of a layout of an opening formed in the pixel defining layer in FIG. 3.

As shown in FIG. 11, exemplarily, the pixel defining layer forms a pixel opening 81. Exemplarily, the pixel opening 81 is an arc printing design with equal pitch, which can improve the printing rate of manufacturing the organic light emitting material and improve the device performance of the display substrate.

Exemplarily, in the same group of subpixels, the two first conductive connection portions 60 are symmetrical about the symmetry axis C, the two first conductive patterns 64 are symmetrical about the symmetry axis C, and the two second conductive patterns 65 are symmetrical about the symmetry axis C, the two third conductive patterns 66 are symmetrical about the symmetry axis C, the two fourth conductive patterns 67 are symmetrical about the symmetry axis C, and the two fifth conductive patterns 68 are symmetrical about the symmetry axis C, the two sixth conductive patterns 69 are symmetrical about the symmetry axis C, the two second conductive connection portions are symmetrical about the symmetry axis C, and the two anode patterns are symmetrical about the symmetry axis C, and the two pixel openings 81 are symmetrical about the symmetry axis C.

Exemplarily, in the two adjacent subpixels along the second direction, the two first conductive connection portions 60 are symmetrical about the longitudinal axis, and the two first conductive patterns 64 are symmetrical about the longitudinal axis, the two second conductive patterns 65 are symmetrical about the longitudinal axis, the two third conductive patterns 66 are symmetrical about the longitudinal axis, the two fourth conductive patterns 67 are symmetrical about the longitudinal axis, and the two fifth conductive patterns 68 are symmetrical about the longitudinal axis, the two sixth conductive patterns 69 are symmetrical about the longitudinal axis, the two second conductive connection portions are symmetrical about the longitudinal axis, the two anode patterns are symmetrical about the longitudinal axis, the two pixel openings 81 are symmetrical about the longitudinal axis, the two first electrode plates Cst1 are symmetrical about the longitudinal axis, and the two second electrode plates Cst2 are symmetrical about the longitudinal axis, the two first active layers 31 are symmetrical about the longitudinal axis, the two second active layers 32 are symmetrical about the longitudinal axis, and the two third active layers 33 are symmetrical about the longitudinal axis, the two light emitting control active layers 34 are symmetrical about the longitudinal axis, and the two driving active layers 35 are symmetrical about the longitudinal axis.

It should be noted that the longitudinal axis is located between two adjacent subpixels along the second direction, and the longitudinal axis extends along the first direction.

Figure 2:
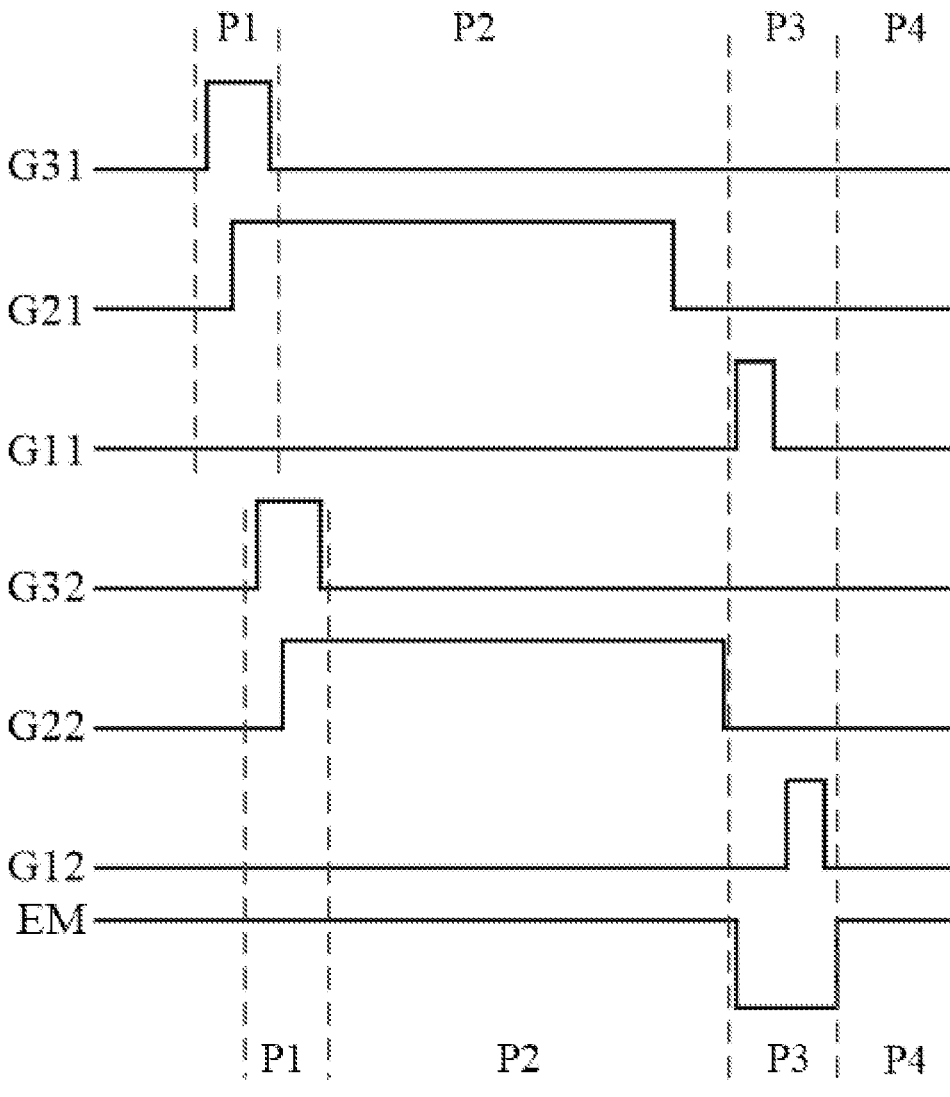
FIG. 2 is a driving timing diagram of a subpixel driving circuit in a group of subpixels according to an embodiment of the present disclosure.

As shown in FIG. 1 and FIG. 2, in the display substrate provided by the above embodiments, the subpixel driving circuit 201 includes a driving transistor T5, a light emitting control transistor T4, a first transistor T1, a second transistor T2, a third transistor T3 and a storage capacitor Cst.

The working processes of the first row of subpixels and the second row of subpixels in each group of subpixels include: a reset phase P1, a compensation phase P2, a data writing-in phase P3 and a light emitting phase P4.

The reset phases of the first row of subpixels and the second row of subpixels are staggered, the compensation phases of the first row of subpixels and the second row of subpixels are partially staggered, and the data writing-in phases of the first row of subpixels and the second row of subpixels are completely staggered.

It should be noted that in the data writing-in phases of the first row of subpixels and the second row of subpixels 203, the light emitting control signal EM is at an invalid level, which can avoid the first electrodes of the first row of driving transistors T5 from continuously receiving the power signal Vd during the process of second subpixel 203 writing the data signal, which avoids the gate-source voltage of the driving transistors T5 of the first row of subpixels from decreasing, which will affect the compensation effect for the subpixel driving circuit 201 in the first subpixel 202.

FIG. 2 illustrates the first scan signal G11 inputted by the first scan line 41, the second scan signal G21 inputted by the second scan line 42, and the third scan signal G31 inputted by the third scan line 43 in the first row of subpixels. FIG. 2 also illustrates the first scan signal G12 inputted by the first scan line 41, the second scan signal G22 inputted by the second scan line 42, and the third scan signal G32 inputted by the third scan line 43 in the second row of subpixels. The light emitting control signal EM is also illustrated in FIG. 2.

As shown in FIG. 3, FIG. 5 and FIG. 11, in some embodiments, the display substrate further includes a pixel defining layer, and the pixel defining layer defines a plurality of pixel openings 81, and the plurality of pixel openings 81 are in one-to-one correspondence to the plurality of subpixels included in the display substrate;

The orthographic projection of the first active layer 31 on the substrate is located within the orthographic projection of the corresponding pixel opening 81 on the substrate;

The orthographic projection of the second active layer 32 on the substrate is located within the orthographic projection of the corresponding pixel opening 81 on the substrate;

The orthographic projection of the third active layer 33 on the substrate is located within the orthographic projection of the pixel defining layer on the substrate;

The orthographic projection of the light emitting control active layer 34 on the substrate is located within the orthographic projection of the pixel-defining layer on the substrate;

The orthographic projection of the driving active layer 35 on the substrate partially overlaps each of the orthographic projection of the pixel defining layer on the substrate and the orthographic projection of the corresponding pixel opening on the substrate.

The above arrangement effectively reduces the layout space occupied by the subpixels, which is beneficial to reduce the layout difficulty of the subpixels and improve the resolution of the display substrate.

Embodiments of the present disclosure further provide a display device including the display substrate provided by the above embodiments.

In the display substrate provided by the above embodiment, the plurality of subpixels are divided into a plurality of groups of subpixels, and the two subpixel driving circuits 201 included in each group of subpixels share the same light emitting control sub-circuit, the layout space occupied by each group of subpixels is greatly reduced. Therefore, the display substrate provided by the above embodiments opti-mizes the layout of a plurality of subpixels, which not only ensures the display substrate to achieve high-resolution display, but also is compatible with GOA logic resources, provides technical support for the realization of high-resolution GIA display for special-shaped display products.

When the display device provided by the embodiment of the present disclosure includes the above-mentioned display substrate, it also has the above-mentioned beneficial effects, which will not be repeated here.

It should be noted that the display device can be any product or component with a display function, such as a TV, a monitor, a digital photo frame, a mobile phone, a tablet computer, etc., wherein the display device also includes a flexible circuit board, a printed circuit board and a back panel.

It should be noted that the "same layer" in the embodiments of the present disclosure may refer to a film layer on the same structural layer. Or, for example, the film layers on the same layer may be a layer structure formed by using the same film forming process to form a film layer with a specific pattern, and then using the same mask to pattern the film layer through one patterning process. Depending on the specific pattern, one patterning process may include a plurality of exposure, development or etching processes, and the specific pattern in the formed layer structure may be continuous or discontinuous. These specific patterns may also be at different heights or have different thicknesses.

In the method embodiments of the present disclosure, the sequence numbers of the steps are not used to limit the sequence of the steps. For those of ordinary skill in the art, the sequence of the steps can be changed without creative work, which also fall within the scope of protection of the present disclosure.

It should be noted that each embodiment in this specification is described in a progressive manner, and the same and similar parts between the various embodiments may be referred to each other, and each embodiment focuses on the differences from other embodiments. In particular, for the method embodiment, since it is basically similar to the product embodiment, the description is relatively simple, and the relevant part can be referred to the part of the description of the product embodiment.

Unless otherwise defined, technical or scientific terms used in this disclosure shall have the ordinary meaning as understood by those ordinary skill in the art to which this disclosure belongs. As used in this disclosure, "first," "second," and similar terms do not denote any order, quantity, or importance, but are merely used to distinguish the various components. "Including" or "comprising" and similar words mean that the elements or things appearing before the word encompass the elements or things recited after the word and their equivalents, but do not exclude other elements or things. Words like "connected" or "coupled" are not limited to physical or mechanical connections, but may include electrical connections, whether direct or indirect. "Up", "Down", "Left", "Right", etc. are only used to represent the relative positional relationship, and when the absolute position of the described object changes, the relative positional relationship may also change accordingly.

It will be understood that when an element such as a layer, film, region or substrate is referred to as being "on" or "under" another element, it can be "directly on" or "under" the other element, or there are intermediate elements.

In the description of the embodiments, the particular features, structures, materials or characteristics may be combined in any suitable manner in any one or more of the embodiments or examples.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising: a substrate and a plurality of subpixels arranged on the substrate, wherein the plurality of subpixels are arranged in an array;

the subpixel includes a subpixel driving circuit and a light emitting element, and the subpixel driving circuit includes a driving sub-circuit and a light emitting control sub-circuit that are coupled to each other; the light emitting element includes an anode pattern;

the plurality of subpixels are divided into a plurality of groups of subpixels, each group of subpixels includes two subpixels arranged along a first direction, and two subpixel driving circuits included in the two subpixels share a same light emitting control sub-circuit, the light emitting control sub-circuit is configured to respectively control the driving sub-circuits in the two subpixels to write a driving signal to the anode pattern;

the subpixel further includes a data line, the data line includes a part extending along the first direction;

wherein the subpixel further comprises:

a light emitting control signal line, wherein the light emitting control signal line includes a part extending along a second direction, the second direction intersects the first direction;

the two subpixel driving circuits included in the two subpixels share the same light emitting control signal line, and the light emitting control signal line is coupled to the light emitting control sub-circuit and configured to control the light emitting control sub-circuit; an orthographic projection of the light emitting control signal line on the substrate is located between orthographic projections of two anode patterns included in the two subpixels on the substrate;

wherein the light emitting control sub-circuit comprises a light emitting control transistor, and a gate electrode of the light emitting control transistor is coupled to the light emitting control signal line, and a second electrode of the light emitting control transistor is coupled to the driving sub-circuit;

the light emitting control transistor includes a light emitting control active layer, the light emitting control active layer includes a part extending along the second direction, and an orthographic projection of the light emitting control active layer on the substrate is located between the orthographic projections of the two anode patterns included in the two subpixels on the substrate;

wherein the subpixel further comprises:

a power line, wherein the power line includes a part extending along the first direction, and power lines included in the two subpixels are coupled to each other;

a first electrode of the light emitting control transistor is coupled to the power line, and the light emitting control transistor is configured to connect or disconnect the power line and the driving sub-circuits in the two subpixels under the control of the light emitting control signal line;

a power connection portion, wherein the power connection portion includes a part extending along the second direction; the two subpixel driving circuits included in the two subpixels share a same power connection portion; an orthographic projection of the power line on the substrate along the second direction is located on a side of an orthographic projection of the light emitting control active layer on the substrate, and the first electrode of the light emitting control transistor is coupled to the power line through the power supply connection portion.

2. The display substrate according to claim 1, wherein the power connection portion and the light emitting control signal line are arranged at a same layer and made of a same material.

3. The display substrate according to claim 2, wherein the plurality of subpixels are divided into a plurality of pixel units, and the pixel unit includes at least two subpixels arranged along the second direction;

the at least two subpixels share a same power line, and the power connection portions included in the at least two subpixels are sequentially coupled.

4. The display substrate according to claim 1, wherein the driving sub-circuit comprises a driving transistor, and a first electrode of the driving transistor is coupled to the second electrode of the light emitting control transistor, a second electrode of the driving transistor is coupled to the anode pattern of the light emitting control transistor element;

the driving transistor includes a driving active layer; in the two subpixel driving circuits, driving active layers included in the two driving transistors are symmetrically arranged along a symmetry axis, and the symmetry axis is extended along the second direction, an orthographic projection of the symmetry axis on the substrate is located between the orthographic projections of the two anode patterns included in the two subpixels on the substrate.

5. The display substrate according to claim 4, wherein the orthographic projection of the symmetry axis on the substrate overlaps the orthographic projection of the light emitting control active layer on the substrate.

6. The display substrate according to claim 4, wherein the subpixel further comprises a first scan line, the first scan line includes a part extending along the second direction;

the subpixel driving circuit further includes a first transistor, a gate electrode of the first transistor is coupled to the first scan line, and a first electrode of the first transistor is coupled to the data line, a second electrode of the first transistor is coupled to the gate electrode of the driving transistor;

the first transistor includes a first active layer, the first active layer includes a part extending along the second direction; in a same subpixel, the first active layer, the driving active layer and the light emitting control active layer are sequentially arranged along the first direction.

7. The display substrate according to claim 6, wherein, in the two subpixel driving circuits, the first active layers included in the two first transistors are symmetrically arranged with respect to the symmetry axis.

8. The display substrate according to claim 6, wherein the plurality of subpixels are divided into a plurality of pixel units, and at least part of the pixel units include a first subpixel, a second subpixel and a third subpixel arranged along the second direction, the first subpixel includes a first data line, the second subpixel includes a second data line, and the third subpixel includes a third data line;

in a first part of pixel units, the first data line is located on a side of the first subpixel away from the second subpixel along the second direction, and the second data line and the third data line are all located between the second subpixel and the third subpixel; there is a first spacer region between the first subpixel and the second subpixel;

in a second part of pixel units, the first data line and the second data line are both located between the first subpixel and the second subpixel, and the third data line is located on a side of the third subpixel away from the second subpixel along the second direction; there is a second spacer region between the second subpixel and the third subpixel.

9. The display substrate according to claim 8, wherein the plurality of groups of subpixels are divided into a plurality of rows of subpixel groups arranged along the first direction, and each row of subpixel groups include a plurality of groups of subpixels arranged in the second direction;

the display substrate further includes a plurality of gate driving circuit layout areas and a plurality of gate driving wiring layout areas;

the plurality of gate driving circuit layout areas are in one-to-one correspondence with the plurality of rows of subpixel groups, and each gate driving circuit layout area includes a first layout area and a second layout area, along the first direction, the first layout area is located on a first side of the corresponding row of subpixel groups, and the second layout area is located on a second side of the corresponding row of subpixel groups;

the plurality of gate driving circuit layout areas are in one-to-one correspondence with the plurality of gate driving wiring layout areas, and the gate driving wiring layout area includes at least two third layout areas arranged along the second direction;

in the at least two third layout areas, at least one third layout area is located in the first spacer region in a corresponding row of subpixel groups; the at least one third layout area is located in the second spacer region in a corresponding row of the subpixel groups.

10. The display substrate according to claim 6, wherein the subpixel further comprises a reference signal line and a second scan line, and the reference signal line includes a part extending along the first direction, the second scan line includes a part extending along the second direction;

the subpixel driving circuit further includes a second transistor, a gate electrode of the second transistor is coupled to the second scan line, a first electrode of the second transistor is coupled to the reference signal line, and a second electrode of the second transistor is coupled to the gate electrode of the driving transistor; the second transistor includes a second active layer, and the second active layer includes a part extending along the second direction; in a same subpixel, the second active layer, the first active layer and the light emitting control active layer are sequentially arranged along the first direction.

11. The display substrate according to claim 10, wherein, in the two subpixel driving circuits, second active layers included in two second transistors are symmetrically arranged with respect to the symmetry axis, wherein the subpixel further comprises a reference connection portion, and the reference connection portion includes a part extending along the second direction; a first electrode of the second transistor is coupled to the reference signal line through the reference connection portion, wherein the plurality of subpixels are divided into a plurality of pixel units, and the pixel unit includes at least two subpixels arranged along the second direction;

subpixels included in two adjacent pixel units arranged along the second direction share one reference signal line, and the reference signal line is located between the two adjacent pixel units, the reference connection portions included in the subpixels are sequentially coupled; and wherein, in a same subpixel, an orthographic projection of the reference connection portion on the substrate, an orthographic projection of the second scan line on the substrate, an orthographic projection of the first scan line on the substrate, and an orthographic projection of the light emitting control signal line on the substrate are sequentially arranged along the first direction.

12. The display substrate according to claim 10, wherein the subpixel further comprises an initialization signal line and a third scan line, each of the initialization signal line and the third scan line includes a part extending along the second direction;

the subpixel driving circuit further includes a third transistor, a gate electrode of the third transistor is coupled to the third scan line, and a first electrode of the third transistor is connected to the initialization signal line, and a second electrode of the third transistor is coupled to the anode pattern of the light emitting element;

the third transistor includes a third active layer; in the same subpixel, the first active layer, the third active layer and the light emitting control active layer are sequentially arranged along the first direction.

13. The display substrate according to claim 12, wherein, in the two subpixel driving circuits, third active layers included in two third transistors are symmetrically arranged with respect to the symmetry axis;

or wherein at least one of the first transistor, the second transistor and the third transistor includes a double gate structure.

14. The display substrate according to claim 12, wherein the subpixel driving circuit further comprises a storage capacitor, and the storage capacitor includes a first electrode plate and a second electrode plate arranged oppositely, the first electrode plate is located between the substrate and the second electrode plate; the first electrode plate is coupled to the gate electrode of the driving transistor, the second electrode plate is respectively coupled to the second electrode of the driving transistor and the anode pattern of the light emitting element;

in two subpixel driving circuits, two first electrode plates are symmetrically arranged with respect to the symmetry axis; and/or, two second electrode plates are symmetrically arranged with respect to the symmetry axis, the subpixel further includes a first conductive connection portion and a second conductive connection portion that are arranged at different layers, the first conductive connection portion is located between the substrate and the second conductive connection portion, the anode pattern is located on a side of the second conductive connection portion away from the substrate;

the second electrode plate is coupled to the first conductive connection portion;

there is a first overlapping area between an orthographic projection of the second conductive connection portion on the substrate and an orthographic projection of the first conductive connection portion on the substrate, and there is a second overlapping area between the orthographic projection of the second conductive connection portion on the substrate and the orthographic projection of the anode pattern on the substrate;

the second conductive connection portion is coupled to the first conductive connection portion through a first via hole, and an orthographic projection of the first via hole on the substrate is located in the first overlapping area; the second conductive connection portion is coupled to the anode pattern through a second via hole, and an orthographic projection of the second via hole on the substrate is located in the second overlapping area, wherein at least part of the orthographic projection of the first conductive connection portion on the substrate is located between the orthographic projection of the third active pattern on the substrate and the orthographic projection of the driving active layer on the substrate, wherein the third active layer includes a first portion and a second portion coupled to each other, and the first portion includes a part extending along the first direction, the second portion includes a part extending along the second direction, the first portion and the second portion are formed into an L-shaped structure; in the same subpixel, the third active layer and the driving active layer are arranged along a third direction, and the third direction intersects both the first direction and the second direction; a 90-degree angle of the L-shaped structure faces the driving active layer, and wherein the display substrate further comprises a data fan-out line arranged on the substrate, the data fan-out line is coupled to a corresponding data line, and the data fan-out line and the second conductive connection portion are arranged at a same layer and made of a same material.

15. The display substrate according to claim 12, wherein the display substrate further comprises a pixel defining layer, and the pixel defining layer defines a plurality of pixel openings, and the plurality of pixel openings are in one-to-one correspondence to the plurality of subpixels included in the display substrate;

an orthographic projection of the first active layer on the substrate is located within an orthographic projection of a corresponding pixel opening on the substrate;

an orthographic projection of the second active layer on the substrate is located within an orthographic projection of a corresponding pixel opening on the substrate;

an orthographic projection of the third active layer on the substrate is located within an orthographic projection of the pixel defining layer on the substrate;

an orthographic projection of the light emitting control active layer on the substrate is located within the orthographic projection of the pixel-defining layer on the substrate;

an orthographic projection of the driving active layer on the substrate partially overlaps each of the orthographic projection of the pixel defining layer on the substrate and an orthographic projection of a corresponding pixel opening on the substrate.

16. A display device comprising the display substrate according to claim 1.

* * * * *